United States Patent [19]
Konushi et al.

[11] Patent Number: 5,070,510
[45] Date of Patent: Dec. 3, 1991

[54] SEMICONDUCTOR LASER DEVICE

[75] Inventors: Fumihiro Konushi, Hirakata; Hiroshi Nakatu, Tenri; Kazuhiko Inoguchi, Nara; Toshiyuki Okumura, Tenri; Akinori Seki, Nara; Haruhisa Takiguchi, Nara; Chitose Nakanishi, Nara; Satoshi Sugahara, Nara; Hiroaki Kudo, Tenri, all of Japan

[73] Assignee: Sharp Kabushiki Kaisha, Japan

[21] Appl. No.: 625,169

[22] Filed: Dec. 10, 1990

[30] Foreign Application Priority Data

| Dec. 12, 1989 | [JP] | Japan | 1-323295 |
| Jan. 22, 1990 | [JP] | Japan | 2-13333 |
| Jan. 31, 1990 | [JP] | Japan | 2-22953 |
| Jan. 31, 1990 | [JP] | Japan | 2-22954 |
| Jan. 31, 1990 | [JP] | Japan | 2-22955 |
| Apr. 4, 1990 | [JP] | Japan | 2-89634 |
| Jun. 20, 1990 | [JP] | Japan | 2-162334 |

[51] Int. Cl.$^5$ ............................................. H01S 3/19
[52] U.S. Cl. ........................................ 372/46; 372/45
[58] Field of Search ........................ 372/44, 45, 46, 43

[56] References Cited

U.S. PATENT DOCUMENTS

| 4,737,961 | 4/1988 | Mori et al. | 372/46 |
| 4,868,838 | 9/1989 | Yamamoto | 372/46 |
| 4,935,935 | 6/1990 | Reed et al. | 372/46 |

FOREIGN PATENT DOCUMENTS

| 0206082 | 12/1982 | Japan | 372/46 |
| 0114477 | 7/1983 | Japan | 372/46 |

OTHER PUBLICATIONS

Journal of Crystal Growth 84, "Orientation Dependence . . . Low-Pressure OMVPE", K. Kamon et al. (1987), pp. 126-132.
Journal of Crystal Growth 93, "A Self-Aligned Ridge Substrate . . . MOVPE", A. Yoshikawa et al. (1988), pp. 843-849.
Electronics Letters, vol. 24, No. 19, Sep. 15, 1988, "Low Threshold . . . One-Step MOCVE", H. Narui et al., 1249-1250.
Kamon et al., "Selective Growth of GaAs and AlGaAs by Low Pressure OMVPE", Lecture in the 2nd Symposium of Crystal Engineering, held on Jul. 19, 1985, pp. 11-15 (with partial English translation).

*Primary Examiner*—Georgia Epps
*Attorney, Agent, or Firm*—Nixon & Vanderhye

[57] ABSTRACT

A semiconductor laser device having a mesa stripe whose side faces are facets of {111} planes is disclosed. In the laser device, a current blocking layer is formed on a semiconductor substrate whose main surface is a (100) plane, and a channel which is oriented along the <011> direction is formed in the current blocking layer. The mesa stripe is formed on the substrate within the channel by a selective growth technique. The mesa stripe has a multilayer structure including an active layer and is covered by a burying layer.

16 Claims, 25 Drawing Sheets

SEMICONDUCTOR LASER DEVICE

BACKGROUND OF THE INVENTION

1. Field of the Invention

This invention relates to a semiconductor laser device suitable as a light source for optical communications and a method of producing the same. In particular, this invention relates to a semiconductor laser device which can emit laser light oscillating stably in a single fundamental transverse mode at low threshold currents, and a method of producing the same.

2. Description of the Prior Art

Semiconductor laser devices which can emit laser light oscillating in the 1 $\mu$m wavelength band region (1.1 to 1.7 $\mu$m) are currently the subject of intensive research with a view to utilization as light sources for optical communications (high-speed long-distance communications). This is due to the fact that the propagation loss in the quartz fibers used for optical communications is extremely small in this wavelength band. In particular, in low-loss quartz fibers manufactured from high-purity materials, no appreciable material dispersion occurs in the 1.3 $\mu$m wavelength, and therefore, by using a semiconductor laser which emits a light having a wavelength in this band, cutoff frequencies exceeding 1 GHz·km can be realized.

FIG. 35 shows a cross-sectional view of a conventional semiconductor laser device of the type used as a 1.3 $\mu$m light source for optical communications. This semiconductor laser device has a buried heterostructure (BH structure).

As shown in FIG. 35, this device comprises a mesa stripe structure in which an n-type indium phosphide cladding layer 22, an undoped InGaAsP active layer 23, a p-type indium phosphide cladding layer 24, and a p-type InGaAsP cap layer 25 is formed upon the semiconductor substrate 21. A burying layer which comprises a p-type indium phosphide current blocking layer 26 and an n-type indium phosphide current blocking layer 27 covers the sides of the mesa stripe structure. The device has an AuZn electrode 28 is formed on a p-type InGaAsP cap layer 25 and an AuGe electrode 29 on the reverse face of the substrate 21.

In the semiconductor laser device illustrated in FIG. 35, the sides of the mesa stripe structure including the active layer 23 are covered by the burying layer, and consequently laser light in a single fundamental transverse mode is obtained. Also, the structure is such that, if a voltage with a forward bias is applied on the mesa stripe structure, then a voltage with a reverse bias is applied upon the p-n junction within the burying layer. Consequently, currents flowing through the burying layer are diminished, and injection currents are confined within the mesa stripe structure. Therefore, the threshold current level is reduced, and stable fundamental transverse oscillation at a low current can be realized.

Next, a method for the production of the semiconductor laser device illustrated in FIG. 35 will be explained. First, using a liquid phase epitaxy (LPE) technique, the n-type indium phosphide cladding layer 22, the undoped InGaAsP active layer 23, the p-type indium phosphide cladding layer 24, and the p-type InGaAsP cap layer 25 are grown, in that order, upon the substrate 21.

Next, in order to form the portion into which the burying layer is to be buried, an etching mask with a mesa stripe pattern of the prescribed width is formed on the p-type InGaAsP cap layer 25, after which the p-type InGaAsP cap layer, p-type indium phosphide cladding layer 24, undoped InGaAsP active layer 23, and n-type indium phosphide cladding layer 22 below the region not covered by the etching mask are etched. In this manner, the mesa stripe structure composed of the indium phosphide cladding layer 22, the InGaAsP active layer 23, an indium phosphide cladding layer 24, and the p-type InGaAsP cap layer 25 is formed over the substrate 21. The pattern of the etching mask defines the width of the active layer 23.

Next, using an LPE technique, the p-type indium phosphide current blocking layer 26 and the n-type indium phosphide current blocking layer 27 are successively grown, in that order from the substrate side, on the region of the substrate 21 above which the n-type indium phosphide cladding layer 22, the undoped InGaAsP active layer 23, the p-type indium phosphide cladding layer 24, and the p-type InGaAsP cap layer have been removed by the etching process. This is performed in such a manner that the burying layer covers the sides of the mesa stripe structure, and, moreover, so that the height of the interface (p-n junction) between the p-type indium phosphide current blocking layer 26 and the n-type indium phosphide current blocking layer 27 is the same as or slightly greater than the height of the active layer 23.

After removal of the etching mask, the AuZn electrode 28 is formed above the p-type InGaAsP cap layer 25 and the n-type indium phosphide current blocking layer 27, and the AuGe electrode 29 is formed on the reverse face of the substrate 21.

In the conventional semiconductor laser illustrated in FIG. 35, the formation of an active layer 23 with the prescribed stripe width necessitates a process whereby, after a multilayer containing the active layer 23 has been formed over the entire substrate 21, a prescribed region of this multilayer is etched with high precision to form a mesa stripe structure with the required width. In order to stabilize the transverse mode oscillation of the laser, the deviation of the width of the active layer 23 from the prescribed value must not exceed the order of 0.1 $\mu$m. However, in the above-described conventional process, the mesa stripe structure is formed by deep etching of a specified portion of the multilayer formed over the entire wafer, and therefore the determination of the width of the active layer 23 with good reproducibility at a precision of this order is extremely difficult. Consequently, a large statistical dispersion arises in the width of the active layer 23.

Moreover, in order to reduce the thresholed current level, the thickness of the various layers must be appropriately controlled so that the height of the p-n junction in the burying layer approximately coincides with the height of the active layer 23. If the height of the p-n junction deviates excessively from the height of the active layer 23, then the currents flowing through the burying layer rather than the active layer 23 increase, and consequently the threshold current level rises.

Also, since etching and other processes are necessary between the crystal growth process for the formation of the mesa stripe structure and the crystal growth process for formation of the burying layer, the overall process is complex. Furthermore, during the period between the two crystal growth processes, impurities may enter the crystal layers from the ambient atmosphere.

FIG. 36 shows another type of conventional semiconductor laser device (Japanese Laid-Open Patent Publication No. 64-25590). This semiconductor laser device comprises a ridge 32 of width 5 μm and height 2.2 μm formed along the <011> direction (direction of the resonator, perpendicular to the plane of the Figure) on the (100)-oriented n-type gallium arsenide substrate 31. Also, the device comprises a triangular mesa stripe structure on the ridge 32. The mesa structure has an n-type gallium arsenide buffer layer 33, an n-type aluminum gallium arsenide cladding layer 34, an undoped GaAs active layer 35, and a p-type aluminum gallium arsenide cladding layer 36 which are laminated, in that order, upon the substrate 31. The side faces of this structure are (111) B facets, and the angle formed between the facet and the surface of the substrate 31 is 54.7°. The side face of the mesa stripe structure constitutes a facet with a specified crystal plane orientation in this manner because the various layers are grown under conditions such that crystal growth on the (111) B plane is difficult.

The device has a multilayer similar to the mesa stripe structure upon the region of the substrate 31 other than that upon which the mesa stripe structure is formed. In addition, the device comprises an n-type aluminum gallium arsenide barrier layer 41, a p-type aluminum gallium arsenide cladding layer 42, and a p-type GaAs contact layer 43 which are formed in that order from the substrate side, and a p-terminal electrode 44 formed over the p-type GaAs contact layer 43 and an n-terminal electrode 45 formed over the reverse face of the substrate 31.

A method for the production of the laser device has the advantage of not requiring an etching process between the crystal growth process for formation of the mesa stripe multilayer structure and the crystal growth process for formation of the burying layer. Also, since the two kinds of crystal growth processes can be performed continuously as a single-step process, the possibility for entry of impurities from the surrounding air into the crystal layers is diminished.

However, in this method, the ridge 32 is formed by deep etching of the substrate 31, and therefore the formation of the ridge 32 with the prescribed width and with a good yield is difficult, which constitutes a problem.

Moreover, since a double heterostructure is formed above the ridge 32, a large level difference exists on the wafer before the formation of the burying layer, and therefore the levelling of the wafer surface by the formation of the burying layer is difficult. If the surface of the wafer is not flat, then, if the semiconductor device is to be mounted on a material such as a heat sink, the proper contact between the heat sink, etc., and the upper surface of the wafer cannot be effected, which constitutes another problem.

Furthermore, in this conventional technology, the thickness of the various layers must be precisely controlled so as to ensure that the height of the p-n junction in the burying layer coincides with the height of the active layer, and consequently the problem of low manufacturing yield also arises.

FIG. 37 shows another type of conventional semiconductor laser device. This semiconductor laser device has a multilayer structure of the same type as that of the mesa stripe structure of FIG. 35 along the <011> direction (direction of resonator, perpendicular to plane of the Figure) over a (100)-oriented n-type indium phosphide substrate 51.

This multilayer structure is formed by depositing a silica film, having a rectangular opening with the long side along the <011> direction, on the n-type indium phosphide substrate 51, after which, using an MOCVD technique, an n-type gallium arsenide buffer layer 52, an n-type aluminum gallium arsenide cladding layer 53, an undoped GaAs active layer 54, and a p-type aluminum gallium arsenide cladding layer 55 are successively formed by selective growth, in that order, within the rectangular opening only. As in the preceding method of fabrication, the side faces of the multilayer structure formed in this manner are (111) B facets. The crystal growth does not occur on the $SiO_2$ film. After the selective crystal growth process, the $SiO_2$ film is removed from the substrate 51 by etching.

Then, using an LPE technique, a p-type aluminum gallium arsenide burying layer 56, an n-type aluminum gallium arsenide burying layer 57, a p-type aluminum gallium arsenide burying layer 58, and a p-type GaAs cap layer 59 are successively formed, in that order, over the substrate 51 from which the $SiO_2$ film has been removed. The surface of the wafer is levelled by the growth of these layers. In order to reduce currents flowing in the burying layers, the height of the interface (p-n junction surface) between the p-type aluminum gallium arsenide burying layer 56 and the n-type aluminum gallium arsenide burying layer 57 is controlled so as to nearly coincide with the height of the active layer 54.

Also, a p-terminal electrode 60 is formed over the p-type InGaAsP cap layer 59 and an n-terminal electrode 61 over the reverse face of the substrate 51.

In this method of fabrication, no ridge is formed on the top surface of the substrate 51, therefore, the level difference on the wafer surface prior to the formation of the burying layers is comparatively small, which tends to facilitate the levelling of the wafer surface by the formation of the burying layers.

However, the precise control of thickness of the burying layers so as to ensure that the p-n junction in the burying layers is formed in the vicinity of the active layer 54 is difficult, and consequently the production yield is low.

Moreover, when the $SiO_2$ film is removed from the substrate 51 by a hydrofluoric acid or other type of etching fluid, concomitant etching damage to the mesa stripe multilayer structure also constitutes a problem. This etching damage reduces the production yield and reliability of the semiconductor laser device.

The above-described semiconductor laser has other problems stated below. In optical instruments employing coherent light, the polarization of the coherent light possesses important significance. In general, the light emitted from semiconductor laser devices is polarized in a TE wave, and the direction of polarization is parallel to the active layer. Therefore, two semiconductor laser devices are required in order to obtain two varieties of laser light with different directions of polarization. For example, if two semiconductor laser devices are arrayed in series, a half-wave plate can be used to rotate the direction of polarization of the light emitted by one of the semiconductor laser devices relative to that of the light emitted by the other, thereby obtaining two laser beams with mutually distinct directions of polarization. However, this conventional technique requires two semiconductor laser devices as well as optical components such as half-wave plates, etc., therefore, a larger number of components is required, which is disadvantageous as regards miniaturization of devices incorporating such devices.

The type of semiconductor laser device illustrated by FIG. 35 has the problem of increased leakage current flowing across the p-n junction of the burying layer concomitantly with elevations in the temperature of the device. Consequently, the driving current required for the desired light output increases when the temperature of device rises. Also, owing to the strong temperature dependence of the current-light output characteristic and oscillation frequency, the temperature characteristics of the semiconductor laser device deteriorate and the reliability decreases.

Furthermore, another problem arises from the fact that the response characteristic of the light output with respect to the modulation of the driving voltage deteriorates due to the formation of junction capacitance in the vicinity of the p-n junction.

In the following, the various problems arising from the burying layers of other conventional burying type semiconductor laser devices will be explained with reference to FIGS. 38 and 39. Both of these semiconductor laser devices have a mesa stripe structure formed by successively growing an n-type cladding layer 72, an active layer 73, a p-type cladding layer 74, and a p-type cap layer 75, in that order, upon an n-type substrate 71. These two devices are characterized by their burying layers.

First, the semiconductor laser device illustrated in FIG. 38 will be described. The burying layer of this semiconductor laser device is a semi-insulating semiconductor layer 81.

The upper surface of the wafer is levelled, and on the levelled upper surface is formed a p-terminal electrode 77. Also, an n-terminal electrode 78 is formed on the reverse side of the substrate.

This semi-insulating semiconductor layer 81 is composed of an epitaxially grown semiconductor layer doped with transitional metals such as chromium, iron or cobalt, etc., as impurities. These impurities form deep-level traps in the semi-insulating semiconductor layer 81. Owing to the trapping by these deep levels of carriers injected into the semi-insulating semiconductor layer 81, almost no current flows within this semi-insulating semiconductor layer 81. Therefore, when the voltage which drives this semiconductor laser device is applied upon the electrodes, the flow of currents injected from the electrodes 77 and 78 is confined in the mesa stripe structure.

However, in the semiconductor laser device of FIG. 38, the following problems arise from the doping of the semiconductor layer with transition metals such as chromium, iron or cobalt as impurities.

If the semi-insulating semiconductor layer 81 (which constitutes the burying layer) is grown by liquid phase epitaxy, then, since the density of deep-level traps formed in the semi-insulating semiconductor layer 81 grown in this manner is low, consequently, carriers injected into the burying layer cannot be adequately trapped, therefore, the insulating effect manifested by the burying layer is inadequate. The low density of deep-level impurities is due to the poor solubility of the transition metals in the melt which is used for an LPE.

On the other hand, if the semi-insulating semiconductor layer 81 is formed by vapor phase growth, then the deep groves between the several mesa stripe structures formed on the substrate 71 prior to subdivision into chips cannot be adequately filled by the semi-insulating semiconductor layer 81.

Moreover, another problem arising in the semiconductor laser device of FIG. 38 is the diffusion of transition metals into the active layer 73 or cladding layer 74 of the mesa stripe structure from the burying layer when the temperature of the latter has been elevated by heat generated during the operation of the said semiconductor laser device. When transition metals diffuse into the active layer 73, the luminous efficiency of the semiconductor laser device drops and the operating life is shortened.

Next, the semiconductor laser device illustrated in FIG. 39 will be described. This semiconductor laser device has a burying layer composed of polyimide resin 91. A thin p-type epitaxially grown layer 92 and a silica layer 93, which serve to protect the semiconductor layers in the mesa stripe structure, are interposed between the polyimide layer 91 and the substrate 71.

The burying layer, being composed of polyimide resin 91, is an electrical insulator. Therefore, when the voltage which drives this semiconductor laser device is applied to the electrodes 77 and 78, the resulting current does not flow through the burying layer. Consequently, the current injected from the electrodes 77 and 78 is confined in the mesa stripe structure.

However, the semiconductor laser device of FIG. 39 involves a problem in that the thermal conductivity of the polyimide layer 91 is low. If the thermal conductivity of the burying layer is low, then the heat generated within the active layer 73 during operation is not adequately conducted to the exterior of the device, hence, the temperature of the said active layer 73 rises. Concomitantly with this temperature elevation of the active layer 73, the threshold current increases, and the differential efficiency drops.

Also, the width of the mesa stripe structure of each of the semiconductor laser devices is of the order of 2 $\mu$m. That is, in order to ensure that the transverse mode of the emitted laser light is of the single fundamental transverse mode, a narrow mesa stripe structure of the order of 2 $\mu$m in width must be formed on the substrate. Since each of these devices has a narrow mesa stripe structure of the order of 2 $\mu$m in width, the mesa stripe structure is easily damaged when the wafer surface is levelled. Owing to this problem, the production yield tends to be low. Moreover, if the width of the mesa stripe structure is greater than the prescribed value, then the semiconductor laser device becomes incapable of stable oscillation in the fundamental transverse mode.

Distributed feedback (DFB) semiconductor laser devices, in which a periodic variation in refractive index is imparted to the current injection site, are currently drawing attention as light sources for communications and optical measurement by virtue of easy oscillation in the single longitudinal mode and stability of oscillatory wavelength even under variations of temperature and driving current. Since high reliability and low driving current are required in this field of application, BH semiconductor laser devices, which oscillate in the fundamental transverse mode at a low-current threshold level, are the principal types used in this field.

FIG. 40 shows an example of a conventional DFB semiconductor laser device with a BH structure. This type of DFB semiconductor laser device is fabricated in the following manner. First, an n-type AlGaAs first cladding layer 732, an undoped gallium arsenide active layer 733, a p-type AlGaAs carrier barrier layer 734, and a p-type AlGaAs guide layer 735 are successively grown, in that order, over the n-type gallium arsenide substrate 731. Next, a diffraction grating is ruled on the upper surface of the p-type AlGaAs guide layer 735. Then, a p-type AlGaAs second cladding layer 736 and a p+-GaAs cap layer 737 are grown on the p-type AlGaAs guide layer 735 upon which the diffraction grating has been ruled. The surface of the p-type AlGaAs second cladding layer would oxidize if exposed, which would impede the subsequent growth processes, and therefore the p+-GaAs cap layer 737 is formed in order to prevent this surface oxidation. Next, two parallel grooves extending down to the substrate are formed by etching, thereby forming a stripe-like mesa. Then, an n-type AlGaAs first current blocking layer 738, a p-type AlGaAs second current blocking layer 739, and an n-type AlGaAs third current blocking layer 701 are successively grown, thereby filling the grooves. Finally, a p+-GaAs contact layer 702 is grown so as to level the surface, after which a p-terminal electrode 703 on the uppersurface and an n-terminal electrode 704 on the reverse side of the substrate are formed.

In order to fabricate the BH type of DFB semiconductor laser device shown in FIG. 40, after growing the p+-GaAs cap layer 737, two parallel grooves must be formed to form the stripe-like mesa. Also, in order to obtained stable single transverse mode oscillations, this etching must be controlled with sufficient accuracy as to ensure the stripe width of the mesa is in the range 1 to 1.5 μm. Moreover, the several current blocking layers must be grown to the desired thickness on the two sides of the stripe-like mesa.

Thus, like other prior art described above, the fabrication of this DFB semiconductor laser device also requires extremely precise etching processes as well as processes for the growth of current blocking layers with highly accurate control, therefore, the number of steps in the overall fabrication process is large. Consequently, these conventional methods of fabrication are poorly suited for mass production. Furthermore, since the characteristics of the devices depend upon the etching precision, shortcomings arise in that performance is necessarily unstable and the manufacturing yield is low.

SUMMARY OF THE INVENTION

The semiconductor laser device of this invention, which overcomes the above-discussed and numerous other disadvantages and deficiencies of the prior art, comprises: a semiconductor substrate; a current blocking layer formed on said semiconductor substrate; a channel formed in said current blocking layer, said channel reaching said substrate; a mesa stripe having a multilayer structure and formed on said substrate within said channel, said multilayer structure including an active layer; a burying layer covering the side faces of said multilayer structure; wherein the main surface of said substrate is a (100) plane, said channel is oriented along the <011> direction, and said side faces of said multilayer structure are facets of {111} planes.

In a preferred embodiment, the electrical resistance of said burying layer is higher than that of said multilayer structure.

In a preferred embodiment, said burying layer consists of an SOG.

In a preferred embodiment, said current blocking layer is made of semiconductor material.

In a preferred embodiment, said current blocking layer is made of dielectric material.

In a preferred embodiment, said current blocking layer is made of semiconductor material containing aluminum.

According to the invention, a method of producing a semiconductor laser device is provided, comprising the steps of: forming a current blocking layer on a semiconductor substrate having a (100) plane as the main surface, forming in said current blocking layer a channel oriented in the <011> direction to reach said substrate; and forming a multilayer structure including an active layer in the form of a mesa stripe on said substrate and within said channel by using a selective growth technique.

According to the invention, a semiconductor laser device is provided, comprising: a semiconductor substrate; a dielectric film formed on said semiconductor substrate; a channel formed in said dielectric film, said channel reaching said substrate; a mesa stripe having a multilayer structure formed on said substrate within said channel, and said multilayer structure including an active layer; and a burying layer covering the side faces of said multilayer structure; wherein the main surface of said substrate is a (100) plane, said channel is oriented along the <011> direction, said side faces of said multilayer structure are facets of {111} planes, said multilayer structure comprises a lower portion including an active layer and an upper portion including a semiconductor layer having a refractive index smaller than that of said active layer, and said semiconductor layer covers the side faces of said active layer.

In a preferred embodiment, the electrical resistance of said burying layer is higher than that of said multilayer structure.

In a preferred embodiment, wherein said burying layer consists of an SOG.

According to the invention, a method of producing a semiconductor laser device is provided, comprising the steps of: forming a current blocking layer on a semiconductor substrate having a (100) plane as the main surface; forming in the said current blocking layer a channel oriented in the <011> direction to reach the said substrate; forming a multilayer structure including an active layer in the form of a mesa stripe on said substrate and within said channel using a selective growth technique; and forming a semiconductor layer having a refractive index smaller than that of said active layer to cover the side faces of said active layer.

According to the invention, a semiconductor laser device is provided, comprising: a semiconductor substrate; a channel formed on said semiconductor substrate; a mesa stripe having a multilayer structure formed on said substrate within said channel, and said multilayer structure including an active layer; and a burying layer covering the said multilayer structure; wherein the main surface of said substrate is a (100) plane, said channel is oriented along the <011> direction, and said side face of said multilayer structure are facets of {111} planes.

In a preferred embodiment, the electrical resistance of said burying layer is higher than that of said multilayer structure.

In a preferred embodiment, said burying layer consists of an SOG.

According to the invention, a method of producing a semiconductor laser device is provided, comprising the steps of: forming a channel oriented in the <011> direction on a semiconductor substrate having a (100) plane as the main surface; and forming a multilayer structure including an active layer in the form of a mesa stripe on said substrate and within said channel by using a selective growth technique.

According to the invention, a semiconductor laser device is provided, comprising: a semiconductor substrate; a stripe-like ridge structure formed on said semiconductor substrate; a first multilayer structure, including a first active region, formed on the upper face of said ridge structure; a second multilayer structure, including a second active region, formed on the one side face of said ridge structure; a third multilayer structure, including a third active region, formed on the other side face of said ridge structure; a burying layer covering said first, second, and third multilayer structures; a first electrode, a second electrode, and a third electrode formed on said burying layer; a first diffusion region formed in said burying layer, and electrically connecting said first multilayer structure to said first electrode; a second diffusion region, formed in said burying layer, and electrically connecting said second multilayer structure to said second electrode; and a third diffusion region, formed in said burying layer, and electrically connecting said third multilayer structure to said third electrode.

According to the invention, a semiconductor laser device is provided, comprising: a semiconductor substrate; a terrace structure formed on said semiconductor substrate; a first multilayer structure, including a first active region, formed on the upper level of said terrace structure; a second multilayer structure, including a second active region, formed on the side face of the escarpment of said terrace structure; a burying layer covering said first and second multilayer structures; a first electrode, and a second electrode formed on said burying layer; a first diffusion region formed in said burying layer, and electrically connecting said first multilayer structure to said first electrode; and a second diffusion region, formed in said burying layer, and electrically connecting said second multilayer structure to said second electrode.

According to the invention, a method of producing a semiconductor laser device is provided, comprising the steps of: forming on a semiconductor substrate with a (100) plane as the main surface a stripe-like ridge structure oriented in the <011> direction; forming a first multilayer structure with a first active region on the upper face of said ridge structure, a second multilayer structure with a second active region on one side face of said ridge structure, and a third multilayer structure with a third active region on the other side face of the said ridge structure, by using a selective growth technique.

According to the invention, a method of producing a semiconductor laser device is provided, comprising the steps of: forming, on a semiconductor substrate with a (100) plane as a main surface, a terrace structure having an escarpment with a side face running along the <011> direction, and forming, on the upper level of said terrace structure, a first multilayer structure including an active region, and a second multilayer structure including an active region on the side face of the escarpment of said terrace structure, by using a selective growth technique.

According to the invention, a semiconductor laser device having a mesa stripe including an active layer in which the side faces of the mesa stripe are covered by a burying layer, wherein said burying layer is an SOG film containing dopants, and the device further comprises a diffusion zone containing said dopants diffused from said burying layer, said diffusion zone being formed in the region of said mesa stripe adjacent to said burying layer.

According to the invention, a method of producing a semiconductor laser device having a mesa stripe including an active layer in which the side faces of the mesa stripe are covered by a burying layer is provided, said method comprising the steps of: forming said burying layer from an SOG solution containing dopants; and doping the region of said mesa stripe adjacent to said burying layer by diffusion of said dopants from said burying layer.

According to the invention, a distributed feedback type semiconductor laser device is provided, comprising: a semiconductor substrate; a mesa stripe having a multilayer structure and formed on said substrate, said multilayer structure including an active layer; a light guide layer formed on the side face of said multilayer structure, on which a diffraction is ruled; and a burying layer covering said light guide layer; wherein the main surface of said substrate is a (100) plane, said channel is oriented along the <011> direction, and said side faces of said multilayer structure are facets of {111} planes.

Thus, the invention described herein makes possible the objectives of:

(1) providing a semiconductor laser device such that the width of the active layer is controlled with high precision, which can oscillate stably in the single fundamental transverse mode at a low threshold current level, as well as a method of producing the same;

(2) providing a semiconductor laser device in which high precision control is not necessary in the step of forming the height of the burying layer, and the top face of the wafer can easily be levelled, as well as methods for accomplishing the same;

(3) providing a semiconductor laser device which can emit two varieties of light polarized in mutually perpendicular directions, as well as a method accomplishing the same;

(4) providing a semiconductor laser device which, although having relatively wide mesa stripe structures, are nevertheless capable of emitting laser light oscillating in a single fundamental transverse mode, and can be manufactured with a high yield, as well as a method of producing the same;

(5) providing a semiconductor laser device which has excellent response characteristics with respect to the modulations of the driving current, in addition to excellent temperature characteristics, as well as a method of producing the same; and (6) providing a semiconductor laser device having a BH structure suitable for mass production, as well as a method of mass producing the same.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
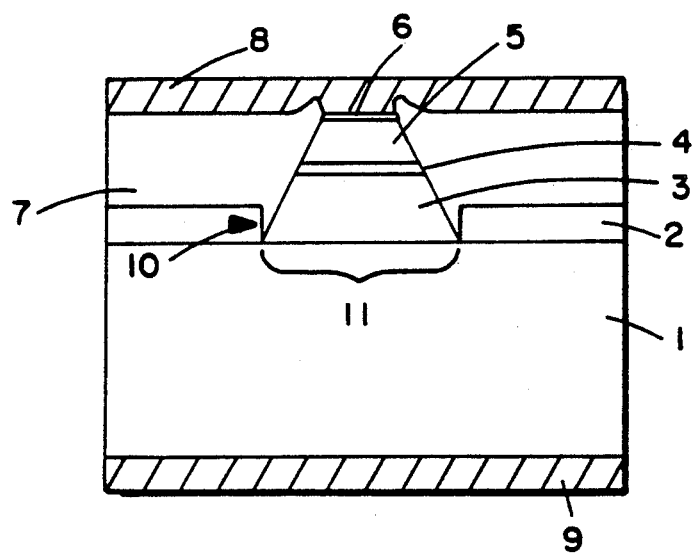
FIG. 1 is a cross-sectional view of a first embodiment of the present invention.

FIG. 1 shows a cross-sectional view of a first embodiment of the present invention. As shown in FIG. 1, a noncrystalline dielectric film 2 of thickness 0.2 to 0.5 $\mu$m, composed of $Si_3N_4$, is formed over a (100)-oriented n-type indium phosphide substrate 1. In the dielectric film 2 is formed a channel 10, of width 5 $\mu$m, running along the [011] direction (resonator direction, perpendicular to the plane of Figure) and extending down to the substrate 1. Owing to the channel 10 reaching the substrate 1 in the dielectric film 2, driving current can flow between the electrodes via the channel 10.

Over the substrate 1 and within the channel 10 is formed a multilayer structure 11. The multilayer structure 11 has a silicon-doped n-type indium phosphide cladding layer 3 (thickness 2 $\mu$m, carrier concentration $n = 1 \times 10^{18}/cm^3$), an undoped GaInAsP active layer 4 (thickness 0.15 $\mu$m, oscillation wavelength 1.3 $\mu$m), a zinc-doped p-type indium phosphide cladding layer 5 (thickness 1 $\mu$m, carrier concentration $p = 5 \times 10^{17}/cm^3$), and a zinc-doped p-type GaInAsP contact layer 6 (thickness 0.1 $\mu$m, carrier concentration $p = 1 \times 10^{18}/cm^3$), in that order from the substrate 1. The side faces of the multilayer structure 11 are (111) B planes, the angle between the side faces and the surface of the substrate 1 being 54.7°. Therefore, the width of the active layer 4, which is 2 $\mu$m in this embodiment, the width of the channel 10, and the thickness of the n-type indium phosphide cladding layer 3 are geometrically determined by this angle.

As a burying layer, an iron-doped indium phosphide layer 7, with resistance (resistivity 0.1M$\Omega$cm) higher than that of the multilayer structure 11, is formed over the region of the substrate 1 and the noncrystaline dielectric film 2 so as to cover the side faces of the multilayer structure 11.

An AuZn electrode 8 is formed above this high-resistance indium phosphide layer and a p-type GaInAsP contact layer 6, while an AuGe electrode 9 is formed on the reverse face of the substrate 1.

Thus, the semiconductor laser device of the present embodiment has a mesa stripe which has the multilayer structure 11 with (111) B facets as side surfaces. The angle between these (111) B facets and the upper surface of the substrate 1 is the crystallographically determined value 54.7°. As will be explained below, this type of mesa stripe having (111) B facets as side faces can be formed by, for example, selective growth using a MOCVD technique.

The stripe width of the active layer 4 is determined by the angle, the width of the channel 10 and the thickness of the n-type indium phosphide cladding layer 3, and is therefore subject to but slight statistical variation, consequently, the transverse oscillatory mode is stable, moreover, variation in characteristics among individual devices is diminished. Also, the burying layer has a high electrical resistance, and moreover, the dielectric layer 2 is formed between the burying layer and the substrate 1, thereby decreasing the current flowing in the burying layer.

A method for the production of the semiconductor laser device illustrated in FIG. 1 will be explained with reference to FIG. 2.

Figure 2A:
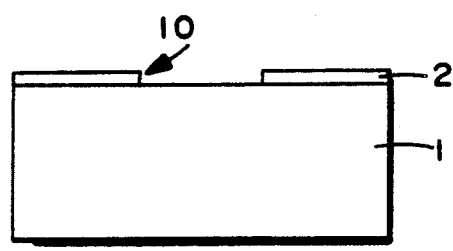
FIGS. 2A through 2E are cross-sectional views illustrating the process of fabrication of the first embodiment of the present invention.

First, the dielectric film 2 composed of $Si_3N_4$ was formed by a plasma CVD technique over the (100)-oriented n-type indium phosphide substrate 1. Next, using a conventional photoetching process, the channel 10 of width 5 $\mu$m running along the [011] direction was formed in the dielectric film 2 (FIG. 2A). Also, the etching conditions were adjusted so that a depth of the channel 10 reached the substrate 1.

Figure 2B:
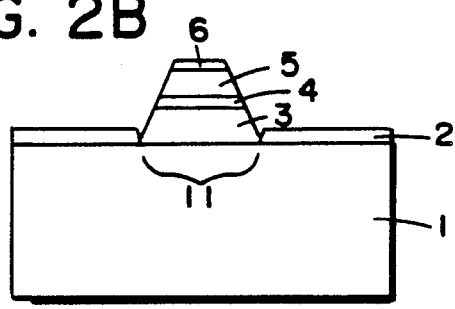

Next, by a selective growth process using an MOCVD method, the multilayer structure 11 with a double heterostructure was formed only on the portion of surface of the substrate 1 within channel 10 (FIG. 2B). In this process, crystal growth does not occur on the noncrystalline dielectric film 2. By appropriately regulating the gaseous species, etc., during the course of crystal growth, the n-type indium phosphide cladding layer 3, the undoped GaInAsP active layer 4, the p-type indium phosphide cladding layer 5, and the p-type GaInAsP contact layer 6 were continuously grown in that order from the side of substrate 1. During this growth process, the substrate temperature was maintained at approximately 650° C. and the pressure of the ambient area at approximately 76 torr. In this selective growth process, the growth rate is subject to a plane orientation dependence which is such that crystal growth does not occur on (111) B planes, and consequently (111) B facets were formed as the side faces of the multilayer structure 11 as a result of the growth process. Thus, above the channel 10 running along the [011] direction, there was formed the multilayer structure 11 with a (100) plane as an upper face and with (111) B planes as side faces running along the channel 10.

Figure 2C:
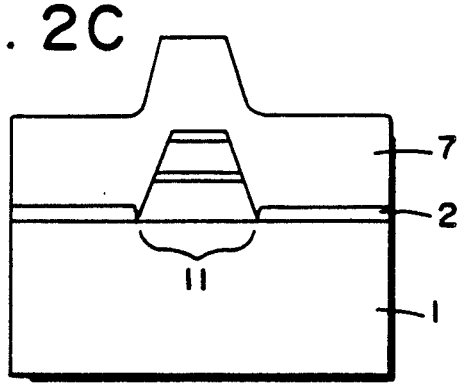

Next, over the dielectric film 2, upon which the multilayer structure 11 had not been formed, a high resistance indium phosphide current blocking layer 7 was grown so as to cover the side faces of the multilayer structure 11. During this growth process, the substrate temperature was maintained at approximately 550° C. and the ambient pressure at approximately 760 torr (normal pressure). Since selective growth does not occur under these growth conditions, layers of nearly equal thickness were grown above both the multilayer structure 11 and the dielectric film 2 (FIG. 2C). Also, since the dielectric film 2 is noncrystalline, the high-resistance indium phosphide current blocking layer 7 grown on this dielectric film 2 is also noncrystalline or polycrystalline.

According to the embodiment, the selective growth process for forming the multilayer structure 11 as well as the nonselective growth process for forming the burying layer were both performed continuously within the same MOCVD apparatus, without removal of the wafer into the external atmosphere, by merely changing the temperature, pressure and other growth conditions.

Figure 2D:
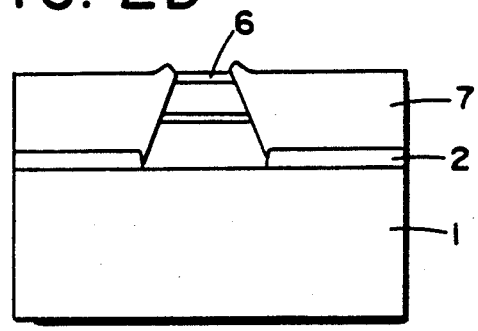

Next, after coating the entire wafer surface with the polyimide resin PIQ (not shown in Figures), this polyimide resin PIQ as well as a portion of the high-resistance indium phosphide current blocking layer 7 were etched from their upper surfaces down to the p-type GaInAsP contact layer 6, thereby levelling the upper surface of the wafer (FIG. 2D).

Figure 2E:
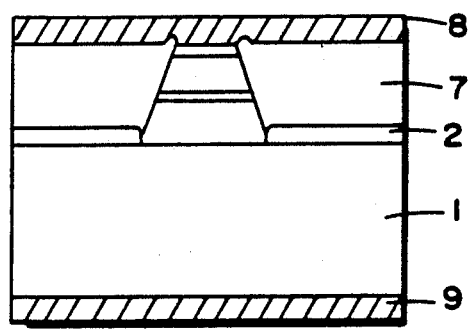

Then, an AuZn electrode 8 was formed over the levelled high-resistance current blocking layer 7 and the p-type GaInAsP contact layer 6, and finally, an AuGe electrode 9 was formed on the reverse face of the substrate 1, thereby producing the semiconductor laser device illustrated in FIG. 2E.

Thus, in the present embodiment, in order to form the active layer 4 with a prescribed width and with high manufacturing yield, a multilayer structure 11 containing the said active layer 4 was selectively grown by MOCVD over the channel 10 on the substrate 1. In this manner, (111) B facets were formed as the side faces of the multilayer structure 11, which grew in the form of a ridge. Since the angle between and these (111) B facets and the surface of the substrate 1 is the crystallographically determined value 54.7°, the width of the active layer 4 could be controlled with high precision by properly adjusting the thickness of the n-type indium phosphide cladding layer 3 with respect to the width of the channel 10. Since the ridge-shaped multilayer structure 11 was formed in this manner, the process for deeply etching a prescribed portion of a multilayer structure formed over the entire surface of the wafer, as in the conventional fabrication methods described above, was not necessary. Therefore, despite the fact that the design value of the width of the active layer 4 was of the order of 2 $\mu$m, deviations from this value were easily kept below 0.1 $\mu$m. Hence, the width of the active layer 4 could be controlled with good reproducibility, and no large statistical dispersion occurred in the width of the said active layer 4.

Moreover, since the selective and the nonselective growth processes were performed continuously within the same MOCVD apparatus and without removing the wafer into the external atmosphere, the process was simple and the also the entry of impurities from the surrounding atmosphere into the crystalline layers was prevented.

Furthermore, the high-resistance indium phosphide current blocking layer 7 which was formed as the burying layer is a high-resistance layer without a p-n junction, high-precision control of the thickness of this layer was not necessary. Therefore, nonuniformity in process control did not give rise to increased flow of currents in the burying layer, and semiconductor laser devices with low threshold level were fabricated with high yield.

Figure 3:
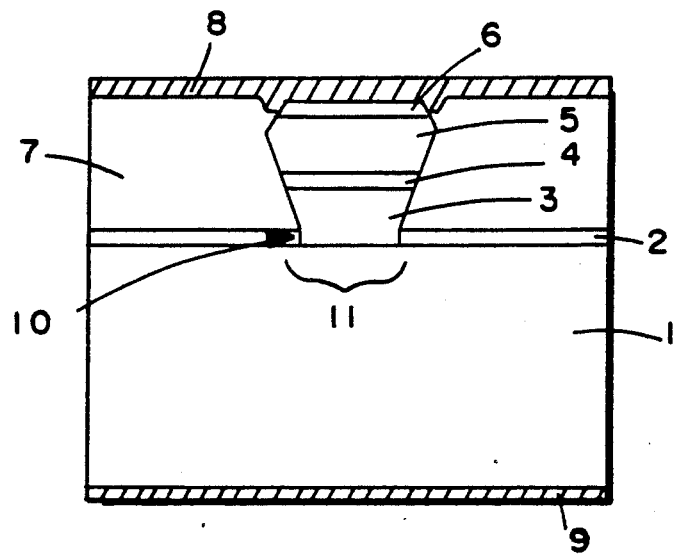
FIG. 3 is a cross-sectional view of a second embodiment of the present invention.

Next, a second embodiment will be explained with reference to FIG. 3. In the second embodiment, the channel 10 runs along the [0$\bar{1}$1] direction.

A noncrystalline dielectric film 2 of thickness 0.3 $\mu$m, composed of $Si_3N_4$ is formed over a (100)-oriented n-type indium phosphide substrate 1, and in this dielectric film 2 is formed a channel 10 of width 1.5 $\mu$m running along the [0$\bar{1}$1] direction (resonator direction, perpendicular to the plane of the Figure). The channel reaches the substrate 1. Owing to the fact that the lengthwise direction of the channel 10 is [0$\bar{1}$1], the angle between the (111) B planes which constitute the side faces of the multilayer structure 11 selectively grown in the channel 10 is the crystallographically determined value 125.3°. Therefore, as shown by FIG. 3, unlike the first embodiment, the width of the active layer 4 in the second embodiment is greater than that of the channel 10. However, in the present embodiment also, the width of the active layer 4 can be controlled with high precision by properly adjusting the thickness of the n-type indium phosphide cladding layer 3 with respect to the width of the channel 10, hence, in this respect, the same efficacy as was realized in the first embodiment can be obtained.

Figure 4:
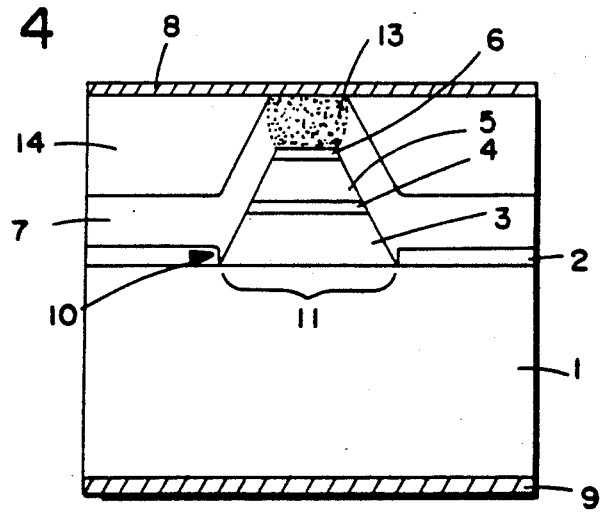
FIG. 4 is a cross-sectional view of a third embodiment of the present invention.

Next, a third embodiment will be explained with reference to FIG. 4. In this third embodiment, the processes up through the formation of the multilayer structure 11 having a double heterostructure are the same as the corresponding processes in the first embodiment, and therefore only the processes beginning with the formation of the burying layer will be explained here.

In the fabrication process of the third embodiment, after the formation of the multilayer structure 11 by a selective growth process, a high-resistance indium phosphide layer 7, which functions as the burying layer, is grown, using the same method as that employed for this purpose in the first embodiment, over the region of the substrate 1 over which the multilayer structure 11 has not been formed. However, one of the points wherein the present process differs from that of the first embodiment is that the thickness of the high-resistance indium phosphide layer 7 in the present case is less than that of the multilayer structure 11.

After the formation of the high-resistance indium phosphide layer 7, p-type impurities are introduced by ion implantation into the portion of the high-resistance indium phosphide layer 7 situated above the p-type GaInAsP contact layer 6, thereby converting this portion only into a low-resistance p-type diffusion layer 13.

Next, after levelling the wafer surface by forming an SOG film 14 on the wafer surface, the surface of the p-type diffusion layer 13 is exposed by etching the SOG film 14.

Finally, an AuZn electrode 8 is formed over the p-type diffusion layer 13 and the SOG film 14, and an AuGe electrode 9 is formed on the reverse face of the substrate 1.

Like those of the other embodiments, the semiconductor laser device of the present embodiment permits the achievement of the stable single transverse mode oscillations with a low current level.

The present embodiment has been explained with reference to an example wherein the levelling of the wafer surface was accomplished by joint use of SOG coating and etching, however, this levelling can also be accomplished by SOG coating alone. Moreover, not only ion implantation methods but also doping methods can be used for the formation of the p-type diffusion layer 13.

Also, although GaInAsP system semiconductor materials were used in each of the embodiments described above, the same effects can also be obtained by using other semiconductor systems, for example, semiconductor materials such as AlGaAs systems, InGaAlP systems, etc. Furthermore, as regards conductivity type, semiconductor materials with conductivity types opposite to those of the above embodiments can also be used.

Moreover, the embodiments were explained with reference to [011] and [0$\bar{1}$1] as the lengthwise directions of the channels, however, other crystallographically equivalent directions represented by <011> can also be used.

Figure 5:
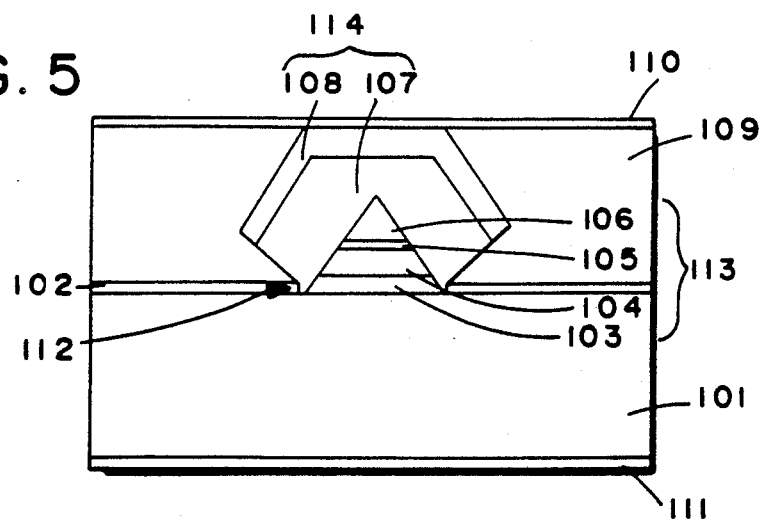
FIG. 5 is a cross-sectional view of a fourth embodiment of the present invention.

FIG. 5 shows a cross-sectional view of a fourth embodiment of the present invention. As shown in FIG. 5, a noncrystalline dielectric film 102, composed of silica, is formed on a (100)-oriented n-type indium phosphide substrate 101 with carrier concentration $n = 2 \times 10^{18}/cm^3$. In the dielectric film 102 is formed a channel 112 of width 5 μm, running along the [011] direction (resonator direction, perpendicular to the plane of the Figure) and reaching the substrate 101. Owing to the channel 112 in the dielectric film 102, driving current can flow between the electrodes via the said channel 112.

Over the substrate 101 and within the channel 112 is formed a multilayer structure. The multilayer structure consisting of an n-type indium phosphide buffer layer 103 (thickness 1 μm, carrier concentration $n = 1 \times 10^{18}/cm^3$), an n-type indium phosphide cladding layer 104 (thickness 1 μm, carrier concentration $n = 1 \times 10^{18}/cm^3$), an undoped InGaAsP active layer 105 (thickness 0.2 μm, oscillation wavelength 1.3 μm), and a p-type indium phosphide cladding layer 106 (thickness 1.5 μm, carrier concentration $p = 1 \times 10^{17}/cm^3$), in that order from the substrate side 101. The multilayer mesa stripe constitutes the lower portion 113 of a mesa stripe to be described below. The cross-section of this lower portion 113 of the mesa stripe is triangular in shape, with (111) B facets as side faces. The angle between the (111) B facets and the surface of the substrate 101 is 54.7°. The width of the active layer 105, which is 2 μm, is geometrically determined by this angle, the width of the channel 112, n-type indium phosphide buffer layer 103 and the thickness of the n-type indium phosphide cladding layer 104.

Over the lower portion 113 of this mesa stripe is formed a p-type indium phosphide layer 107 (thickness 2 μm, carrier concentration $p = 1 \times 10^{18}/cm^3$), with refractive index lower than that of the active layer 105, in such a manner as to cover the side faces of the active layer 105. Also, a p-type InGaAsP cap layer 108 (thickness 0.5 μm, carrier concentration $p = 6 \times 10^{18}/cm^3$) is formed above the p-type indium phosphide layer 107.

Thus, a mesa stripe is formed by a lower portion 113 consisting of the n-type indium phosphide buffer layer 103, the n-type indium phosphide cladding layer 104, the undoped InGaAsP active layer 105, and the p-type indium phosphide cladding layer 106, combined with an upper portion 114 consisting of the p-type indium phosphide layer 107 and the p-type InGaAsP layer 108.

As shown by FIG. 5, the cross-sectional shape of the said mesa stripe is hexagonal. The p-type indium phosphide layer 107 and the p-type InGaAsP cap layer 108 are not formed on the silica dielectric film 102.

As a burying layer, an SOG (spin-on glass) film 109, with excellent insulating characteristics, is formed over the region of the substrate 101 other than that upon which the mesa stripe has previously been formed, so as to cover the side faces of the mesa stripe.

The upper surface of the wafer is levelled by covering the mesa stripe with the SOG film 109. An AuZn electrode 110 is formed over this levelled upper surface of the wafer and an AuGe electrode 111 is formed on the reverse face of the substrate 101.

Thus, the lower portion 113 of the mesa stripe of the semiconductor laser device of the present embodiment has (111) B facets as side faces, and the angle between these (111) B facets and the surface of the substrate 101 is the crystallographically determined value 54.7°. Therefore, the semiconductor laser device of the present embodiment has an active layer 105 with a width determined by this angle, the width of the channel 112, and the combined width of the n-type indium phosphide buffer layer 103 and the n-type indium phosphide cladding layer 104. Consequently, the transverse oscillatory mode is stable, moreover, variation in oscillatory characteristics among individual devices is slight.

The side faces of the InGaAsP active layer 105 in the lower portion 113 of the mesa stripe are covered by the p-type indium phosphide layer 107 of the upper portion 114 of the mesa stripe, and the refractive index of the p-type indium phosphide layer 107 is lower than that of the active layer 105. Therefore, the laser light generated in the interior of the active layer 105 is effectively confined within the said active layer 105. Also, owing to the built-in potential generated at the interface between the InGaAsP active layer 105 and the p-type indium phosphide layer 107, the carriers injected into the active layer 105 are confined within the said active layer 105. Therefore, the injected carriers effectively contribute to the laser oscillations, and the threshold current level is lowered.

Also, since the lower portion 113 of the mesa stripe multilayer structure, which includes the active layer 105, is surrounded by the p-type indium phosphide layer 107, which has comparatively high thermal conductivity, the heat generated in the active layer 105 is rapidly released from the lower portion 113 into the burying layer. Moreover, the thermal expansion coefficient of the InGaAsP active layer 105 is comparatively close to that of the p-type indium phosphide layer 107, hence, differences in thermal expansion rates do not cause crystal defects or other adverse effects in the vicinity of the interface between the InGaAsP active layer 105 and the p-type indium phosphide layer 107, and therefore interfacial levels are not prone to arise. Hence, the configuration of the present embodiment provides long-life semiconductor laser devices with excellent temperature characteristics and reliability. These excellent characteristics would be difficult to obtain with a configuration allowing direct contact between the lower portion 113 of the mesa stripe multilayer structure and the SOG layer 109.

Since the SOG layer 109 which constitutes the burying layer has superior insulating characteristics and lower permittivity than the semiconductors conventionally used as burying layers, the reactive current flowing in the burying layer is diminished, and, moreover, excellent high-speed response characteristics are obtainable.

The current versus light output characteristics of semiconductor laser devices having a semiconductor layer (active layer) emitting long-wave laser light are usually very susceptible to changes arising from temperature fluctuations. In particular, the current-light output characteristics of semiconductor laser devices possessing configurations with burying layers including p-n junctions upon which a reverse bias is applied are especially prone to changes concomitant with temperature fluctuations, since the leakage currents of the p-n junctions has strong temperature dependence. Therefore, a configuration such as that of the present embodiment, employing an SOG film (without p-n junctions) as the burying layer, is highly suitable for semiconductor laser devices emitting long-wave light.

Figure 6A:
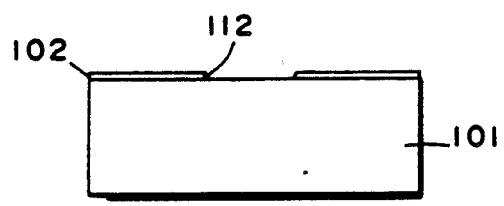
FIGS. 6A through 6E are cross-sectional views illustrating the process of fabrication of the fourth embodiment of the present invention.

A method of fabrication of the semiconductor laser device illustrated in FIG. 5 will be explained with reference to FIG. 6. First, the dielectric film 102 was deposited by a plasma CVD technique over a (100)-oriented n-type indium phosphide substrate 101. Next, using a conventional photoetching process, the channel 112 of width 5 $\mu$m, running along the [011] direction, was formed in the dielectric film 102 (FIG. 6A). The etching conditions were adjusted so that the depth of the channel 112 reached the substrate 101.

Figure 6B:
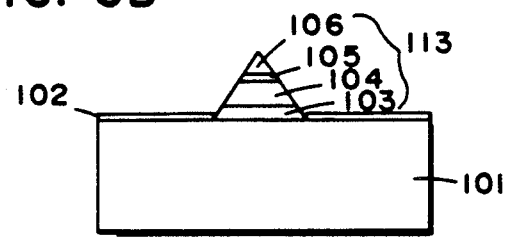

Next, by a selective growth process using a MOCVD method, the multilayer structure which was to constitute the lower portion 113 of the mesa stripe was formed on the portion of surface of the substrate 101 within channel 112 (FIG. 6B). By appropriately regulating the gaseous species, etc., during the course of crystal growth, the n-type indium phosphide buffer layer 103, the n-type indium phosphide cladding layer 104, the undoped InGaAsP active layer 105, and the p-type indium phosphide cladding layer 106 were continuously grown in that order from the side of the substrate 101. During this growth process, the substrate temperature was maintained at approximately 650° C. and the pressure of the ambient area at approximately 10 torr. In this selective growth process, the growth rate is subject to a plane orientation dependence which is such that crystal growth does not occur on (111) B planes, and consequently (111) B facets were formed as the side faces of the multilayer structure as a result of this growth process. Thus, the lower portion 113 of the mesa stripe, with (111) B planes as side faces, and with a triangular cross-section, was formed above the channel 112 running along the [011] direction.

Figure 6C:
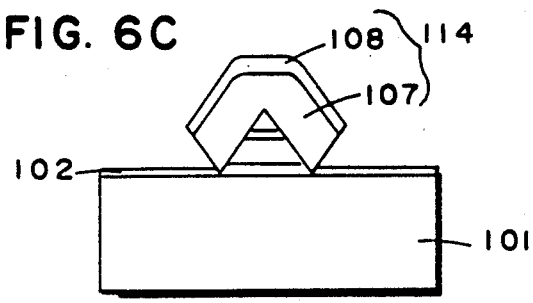

Next, using an LPE technique (growth temperature 600° C.), the p-type indium phosphide layer 107 and the p-type InGaAsP cap layer 108 were successively formed, thereby forming a mesa stripe (FIG. 6C). These layers grew only on the (111) planes of the lower portion 113 of the mesa stripe, and not on the silica dielectric layer 2. In this manner, the side faces of the active layer 105 were covered by the p-type indium phosphide layer 107 with refractive index lower than that of the said active layer 105.

Figure 6D:
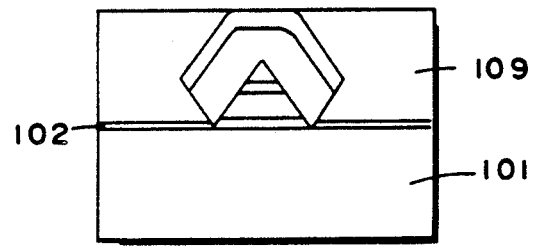
Figure 6E:
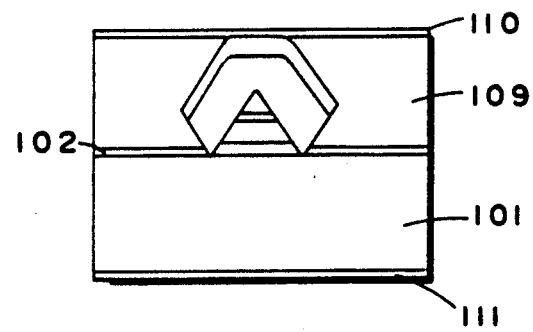

Next, an SOG solution was coated onto the top of the wafer by a spin coating technique, thereby levelling the wafer surface which had been rendered irregular by the formation of the mesa stripe. The silica concentration in the SOG solution used for this purpose was 20%, and the wafer was rotated at 1000 rpm for a period of 30 seconds while the said SOG solution was applied. After coating, the wafer was baked at 450° C. for 30 minutes. By this process, a vitreous SOG film 109 was formed over the dielectric film 102 in such a manner as to bury the outside of the mesa stripe (FIG. 6D).

Finally, the AuZn electrode 10 was formed on the wafer surface which had been levelled by the SOG film 109, and the AuGe electrode 11 was formed on the reverse face of the substrate 101 (FIG. 6E), thereby producing the semiconductor laser device of FIG. 5.

Thus, in the present embodiment, in order to form an active layer 105 with a prescribed width and with good manufacturing yield, an MOCVD technique was used to selectively form the multilayer structure including the active layer 105 in the form of a mesa stripe above the channel 112 on the substrate 101. In this manner, (111) B plane facets were formed as the side faces of the multilayer structure. Since the angle between these (111) B facets and the surface of the substrate 101 is the crystallographically determined value 54.7°, the width of the active layer 105 could be controlled with high precision by properly adjusting the thickness of the n-type indium phosphide buffer layer 103 and the n-type indium phosphide cladding layer 104 with respect to the width of the channel 112. In the present embodiment, a process for deeply etching a prescribed portion of a multilayer structure formed over the entire surface of the wafer, as in the conventional fabrication methods described above, was not necessary. Therefore, despite the fact that the design value of the width of the active layer 105 was of the order of 2 μm, deviations from this value were easily kept below 0.1 μm. Hence, the width of the active layer 105 could be controlled with good reproducibility, and no large statistical dispersion occurred in the width of the active layer 105.

Moreover, the SOG film 109 which was employed as the burying layer has a high electrical resistance as well as displaying excellent adhesion to the dielectric film 102, which permits the fabrication with good yield of semiconductor laser devices having low threshold currents. Furthermore, in the present embodiment, the method used to form the burying layer consisting of an SOG film 109, that is, spin coating, permits the formation of a level film over the wafer surface in a simple manner, and therefore the wafer surface is more readily levelled as compared with conventional fabrication methods wherein burying layers consisting of semiconductor films are formed by a crystal growth processes.

Figure 7:
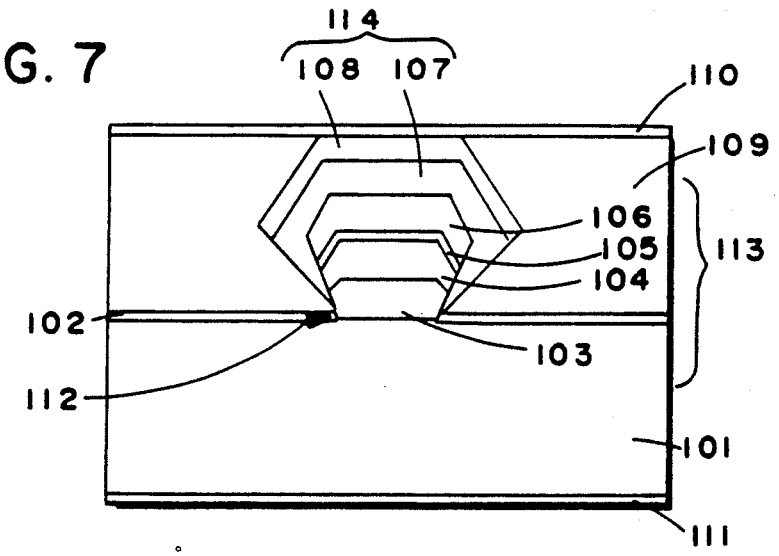
FIG. 7 is a cross-sectional view of a fifth embodiment of the present invention.

FIG. 7 shows a cross-sectional view of the semiconductor laser device according to fifth embodiment of the present invention. Crystallographically, the longitudinal direction of the channel in the semiconductor laser device illustrated by FIG. 5 is [011], whereas that of the channel in the present embodiment is [00$\bar{1}$]. Consequently, in the present embodiment, the lower portion 113 of the mesa stripe selectively grown by the MOCVD method is hexagonal, as shown in FIG. 7. The active layer 105 is composed of a portion parallel to the substrate 101 and a portion inclined toward the substrate 101.

The side faces of the lower portion 113 of the multilayer structure formed in the present embodiment are, like those of the corresponding lower portion 113 in the preceding embodiment, {111} planes. Above this lower portion 113, an n-type indium phosphide layer 107 with lower refractive index then the active layer 105 is selectively formed in such a manner as to cover the lateral faces of the active layer, and a p-type InGaAsP cap layer 108 is formed over the n-type indium phosphide layer 107.

In the present embodiment also, a mesa stripe is formed by combination of a lower mesa stripe multilayer structure 113, formed by successive superposition of an n-type indium phosphide buffer layer 103, an n-type indium phosphide cladding layer 104, an undoped InGaAsP active layer 105, and a p-type indium phosphide cladding layer 106, in that order from the side of the substrate 101, with an upper mesa stripe multilayer structure 114 consisting of an indium phosphide layer 107 and an InGaAsP cap layer 108.

In the active layer 105, laser light is confined in the portion of the layer which is parallel to the surface of the substrate 101. In order to secure laser oscillations in the single fundamental transverse mode, the width of the portion of the active layer 105 which is parallel to the substrate 121 must be set to a value of the order of 2 μm. For this reason, the width of the channel formed in the dielectric layer 102 must be smaller than that of the corresponding channel in the semiconductor laser device shown in FIG. 5.

Like the semiconductor laser devices of the embodiments described above, the semiconductor laser device of the present embodiment displays excellent temperature characteristics and reliability, as well as small current flowing through the burying layer and superior high-speed response characteristics.

Also, explanations were presented with reference to examples wherein InGaAsP/InP systems are used as semiconductor materials. However, the same efficacy as that already described in connection with the embodiments can also be obtained in semiconductor laser devices employing other semiconductor materials, for example, GaAlAs/GaAs systems, etc. In such cases, the semiconductor layers which are formed over the lower portion 113 of the mesa stripe multilayer structure with {111} planes as side faces can be formed from semiconductor materials with the same composition as that of the cladding layers in the lower portion 113.

Moreover, as regards methods for the selective growth upon the substrate within the channel area of the lower portion 113 of the mesa stripe multilayer structure possessing {111} plane facets, MBE as well as MOCVD techniques can be used for this purpose.

Furthermore, as regards the conductivity type of the various semiconductor layers, semiconductor materials with conductivity types opposite to those of the above embodiments can also be used.

Not only silica but also other dielectric materials can be used for the dielectric layers, for example, silicon nitride layers, alumina layers, and various types of plastic layers composed of materials such as photosensitive polyimide resins or resists, etc., are suitable for the present purpose.

As for the burying layer, not only SOG films but also films composed of plastic materials such as polyimide resins, etc., are applicable for this purpose.

Figure 8:
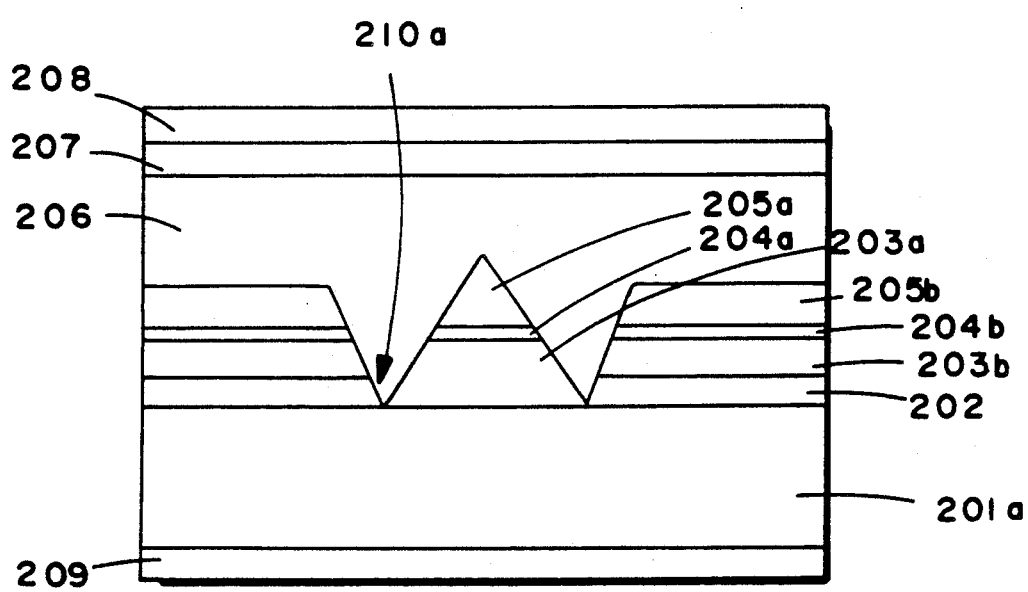
FIG. 8 is a cross-sectional view of a sixth embodiment of the present invention.

FIG. 8 shows a cross-sectional view of a sixth embodiment of the present invention. A semi-insulating vanadium-doped gallium arsenide current blocking layer 202 of thickness 0.5 μm and resistivity of the order $1 \times 10^6$ Ωcm is formed above a (100)-oriented n-type gallium arsenide substrate 201a.

In this semi-insulating gallium arsenide current blocking layer 202 is formed a channel 210a, 3 μm in width, running along the [011] direction (resonator direction, perpendicular to the plane of the Figure) and extending down to the substrate 201a. Owing to the channel 210a in the said semi-insulating gallium arsenide current blocking layer 202, driving current flows between the electrodes via the said channel 210a.

A mesa stripe structure with triangular cross-section is formed on the substrate 201a and within the channel 210a. The mesa stripe structure has a selenium-doped n-type AlGaAs cladding layer 203a (thickness 1.0 μm, carrier concentration $n = 1 \times 10^{18}/cm^3$), an undoped AlGaAs active layer 204a (thickness 0.1 μm), and a zinc-doped p-type AlGaAs cladding layer 205a (thickness 1.0 μm, carrier concentration $p = 1 \times 10^{18}/cm^3$) laminated in that order from the substrate side. The side faces of this mesa stripe structure are {111} B planes, hence, the angle between these side faces and the upper surface of the substrate 201a is 54.7°. Therefore, the width of the active layer 204a, which is 1.5 μm, is geometrically determined by this angle, the width of the channel 210a, and the thickness of the n-type AlGaAs cladding layer 203a.

On the other hand, over the semi-insulating gallium arsenide current blocking layer 202 are formed a selenium-doped n-type AlGaAs cladding layer 203b, an undoped AlGaAs active layer 204b, and a zinc-doped p-type AlGaAs cladding layer 205b, in that order from the substrate side.

A p-type AlGaAs burying layer 206 (thickness 5 μm, carrier concentration $p=1\times 10^{18}/cm^3$) is formed over the p-type AlGaAs cladding layers 205a and 205b. The p-type AlGaAs burying layer 206 covers the mesa stripe structure.

A zinc-doped p-type gallium arsenide contact layer 207 (thickness 0.3 μm, carrier concentration $p=1\times 10^{19}/cm^3$) is formed over the p-type AlGaAs burying layer 206.

An Au/Zn electrode 208 is formed over the p-type gallium arsenide contact layer 207, and an Au/Ge electrode 209 is formed on the reverse face of the substrate 201a.

Since the width of the active layer 204a in the semiconductor laser device of the present embodiment can be adjusted through the width of the channel 210a and the thickness of the n-type gallium arsenide cladding layer 203a, the transverse oscillations of the emitted laser light can be restricted to the single fundamental mode, and moreover, the degree of nonuniformity among the characteristics of individual devices is slight.

Furthermore, in the semiconductor laser device of the present embodiment, a mesa stripe structure is formed within a concave portion above the substrate 201a, moreover, since the multilayer structure grown when this mesa stripe structure is formed is also present above areas other than the concave portion, the upper surface of the wafer is adequately levelled by the burying layer, etc.

Next, the method of fabrication of the semiconductor laser device illustrated by FIG. 8 will be explained with reference to FIG. 9.

Figure 9A:
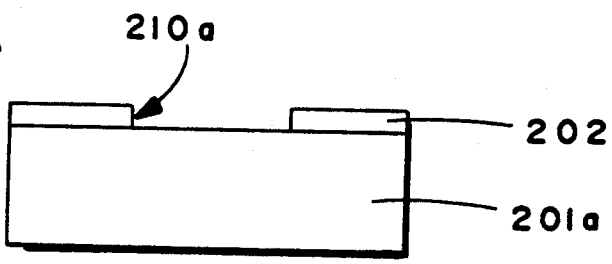
FIGS. 9A through 9C are cross-sectional views illustrating the process of fabrication of the sixth embodiment of the present invention.

First, the vanadium-doped semi-insulating gallium arsenide current blocking layer 202 was formed by an MOCVD technique over the (100)-oriented n-type gallium arsenide substrate 201a. Next, using a conventional photoetching process, the channel 210a of width 3 μm running along the [011] direction was formed in the said semi-insulating gallium arsenide current blocking layer 202 (FIG. 9A). Also, the etching conditions were adjusted so that the depth of the channel 210a reached the substrate 201a.

Figure 9B:
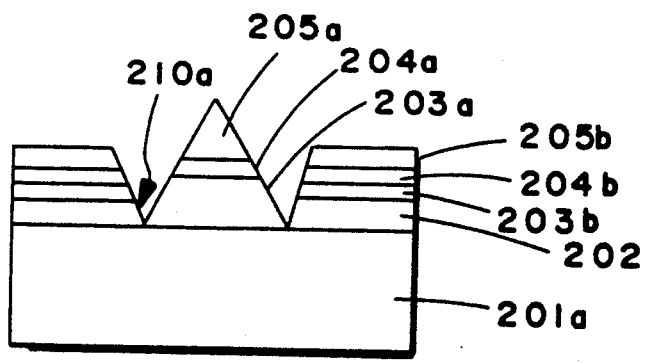
Figure 9C:
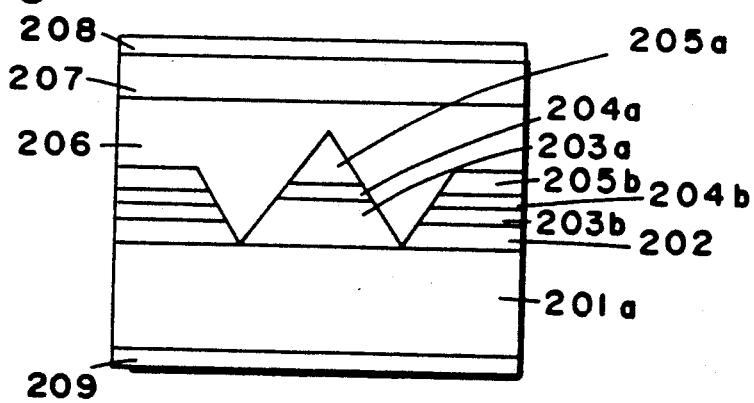

Next by a selective growth process using an MOCVD method, the mesa stripe structure with a triangular cross-section was formed on the portion of the surface of the substrate 201a within the channel 210a (FIG. 9B). In this crystal growth process, by appropriately regulating the gaseous species, etc., the n-type AlGaAs cladding layer 203a, the undoped AlGaAs active layer 204a, and the p-type AlGaAs cladding layer 205a were continuously grown in that order from the side of the substrate 201a. During this growth process, the V/III ratio was 120, while the substrate temperature was maintained at approximately 750° C. and the pressure of the ambient at approximately 50 torr. Under these growth conditions, the growth rate is subject to a plane orientation dependence which is such that crystal growth does not occur on {111} planes, and consequently {111} B facets were formed as the side faces of the mesa stripe structure as a result of the growth process. Thus, above the channel 210a running along the [011] direction, there was formed the mesa stripe structure with a triangular cross-section and with {111} B planes as the side faces running along the channel 210a.

Simultaneously, during the crystal growth process, the n-type AlGaAs cladding layer 203b, the undoped AlGaAs active layer 204b and the p-type AlGaAs cladding layer 205b, in that order from the side of the substrate 201a, were also continuously grown over the semi-insulating gallium arsenide current blocking layer 202.

Next, the p-type AlGaAs burying layer 206 and the p-type gallium arsenide contact layer 207 were successively grown so as to cover the said mesa stripe structure and the p-type AlGaAs cladding layer 205b. During this crystal growth process, the substrate temperature was maintained at approximately 750° C. and the ambient pressure at 760 torr. The crystal growth conditions are nonselective with respect to crystal plane orientation. Therefore, the p-type AlGaAs burying layer 206 also grew on the side faces of the said mesa stripe structure, and consequently the resulting upper surface of the p-type AlGaAs burying layer 206 was level.

In the present embodiment, the selective growth process for forming the mesa stripe structure as well as the nonselective growth process for forming the burying layer were performed continuously within one and the same MOCVD apparatus, without contact between the wafer and the external atmosphere.

An Au/Zn electrode 208 was formed over the level upper surface of the p-type gallium arsenide layer 207, and an Au/Ge electrode 209 was formed on the reverse face of the substrate 201a (FIG. 9C), thereby completing the fabrication of the semiconductor laser device of FIG. 8.

Thus, in the present embodiment, using MOCVD techniques, a mesa stripe structure including the active layer 204 was selectively grown above the channel 210a on the substrate 201a, and {111} B plane facets were formed as side faces of the said mesa stripe structure.

Moreover, since the selective and nonselective growth processes were performed continuously within one and the same MOCVD apparatus and without contact between the wafer and the external atmosphere, the overall fabrication process was simplified, and the entry of impurities from the surrounding air into the crystal layers was prevented.

Figure 10:
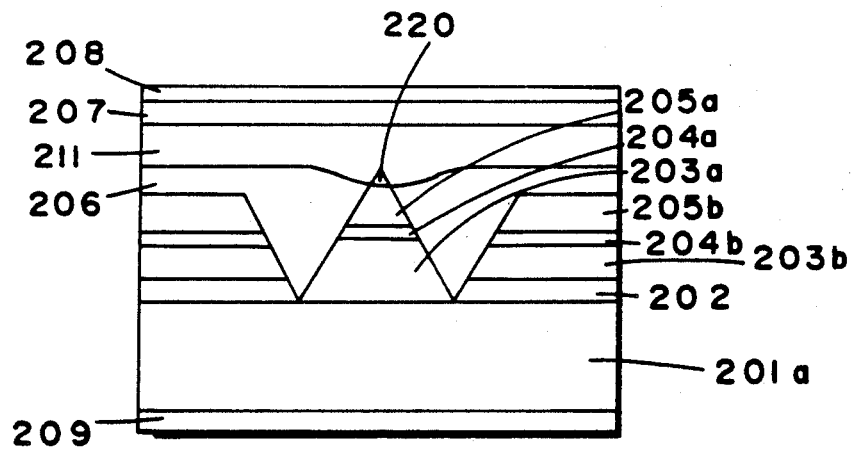
FIG. 10 is a cross-sectional view of a seventh embodiment of the present invention.

Next, a seventh embodiment will be explained with reference to FIG. 10. The major differences between the present embodiment and the sixth embodiment described above consist in the presence of a p-type Al$_X$Ga$_{1-X}$As (X≧0.7) layer 220 above the p-type AlGaAs cladding layer 205a and the fact that the burying layer 206 in the present embodiment is a semi-insulating AlGaAs layer. The p-type Al$_X$Ga$_{1-X}$As layer 220 has a high aluminum content, and therefore the semi-insulating AlGaAs burying layer 206 displays almost no growth on the layer 220.

A p-type AlGaAs cladding layer 211 is formed over the semi-insulating AlGaAs burying layer 206, and a p-type gallium arsenide contact layer 207 is formed over layer 211.

An Au/Zn electrode 208 is formed over the p-type gallium arsenide contact layer 207, and an Au/Ge electrode 209 is formed on the reverse face of the substrate 201a.

The semiconductor laser device of the present embodiment, like that of the sixth embodiment described above, can emit laser light stably in a single fundamental transverse mode even at low current levels.

Also, although both the sixth and seventh embodiments utilize semi-insulating semiconductor materials as the current blocking layer 202 in which the channel 210a is located, a semiconductor layer with a conductivity type opposite to that of the substrate could also be employed for this purpose.

Figure 11:
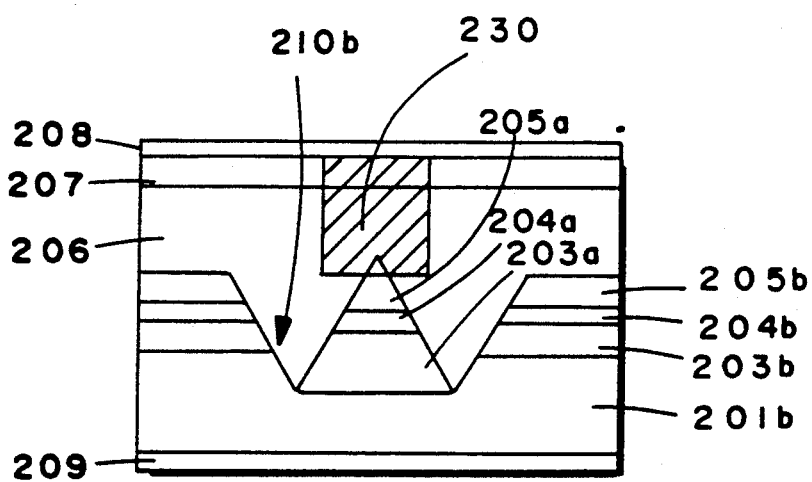
FIG. 11 is a cross-sectional view of an eighth embodiment of the present invention.

Next, an eighth embodiment will be explained with reference to FIG. 11. In the present embodiment, unlike the above-described sixth and seventh embodiments, no semi-insulating gallium arsenide current blocking layer with a channel is formed above the (100)-oriented n-type gallium arsenide substrate 201b. In place of this, in the present embodiment, a channel 210b of width 3 μm and depth 0.5 μrunning along the [011] direction (resonator direction, perpendicular to the plane of the Figure) is formed directly in the substrate 201b by etching the upper surface of the substrate 201b.

A mesa stripe structure similar to that of the embodiments described above is formed on the channel 210b in the substrate 201b by the same type of crystal growth process as the used in the preceding embodiments.

Above the portion of the substrate 201b other than that upon which the said channel 210b has been formed, an n-type AlGaAs cladding layer 203b, an undoped AlGaAs active layer 204b, and a p-type AlGaAs cladding layer 205b, in that order from the side of the substrate 201b, are laminated by a method similar to that employed in the various embodiments described above.

A semi-insulating AlGaAs burying layer 206 is formed above the p-type AlGaAs cladding layers 205a and 205b so as to cover the mesa stripe structure, and above this is formed a p-type gallium arsenide contact layer 207.

An Au/Zn electrode 208 is formed over the p-type gallium arsenide contact layer 207, and an Au/Ge electrode 209 is formed on the reverse face of the substrate 201b.

In the semi-insulating AlGaAs burying layer 206 and p-type gallium arsenide contact layer 207, a stripe-shaped diffusion zone 230, into which zinc has been selectively diffused, is formed in apposition to the channel 210b formed in the substrate 201b. This stripe-shaped diffusion zone 230 serves to form a confined current path between the p-type AlGaAs cladding layer 205a and the p-type gallium arsenide contact layer 207.

The semiconductor laser device of the present embodiment, like those of the other embodiments, can emit laser light stably in the single fundamental transverse mode even at low current level.

Figure 12:
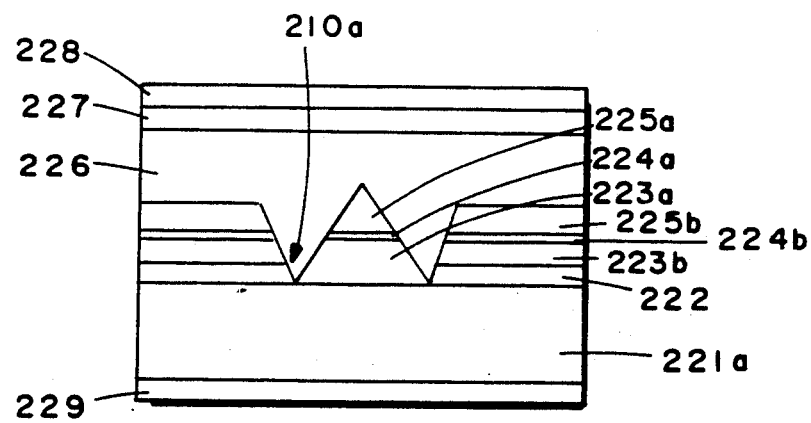
FIG. 12 is a cross-sectional view of a ninth embodiment of the present invention.

Next, a ninth embodiment, formed with the use of an indium phosphide substrate, will be explained with reference to FIG. 12. The semiconductor laser device of the present embodiment has the same structure as that of the sixth embodiment, but differs from the latter in the specific materials used for the various semiconductor layers.

Upon the (100)-oriented n-type indium phosphide substrate 221a is formed a current blocking layer 222 of thickness 0.5 μm and resistivity $1 \times 10 M\Omega cm$, consisting of iron-doped semi-insulating $Ga_X In_{1-X} P_Y As_{1-Y}$ (X=0.46 (1−Y), 0≦X≦1), lattice-matched with the indium phosphide substrate 221a. A channel 210a of width 3 μm, reaching the substrate 221a and running along the [011] direction (resonator direction, perpendicular to the plane of the Figure) is formed in the semi-insulating $Ga_X In_{1-X} P_Y As_{1-Y}$ current blocking layer 222.

A mesa stripe structure with triangular cross-section is formed by successively superimposing, upon the portion of the surface of the substrate 221a within the channel 210a, a silicon-doped n-type indium phosphide cladding layer 223a (thickness 1.0 μm, carrier concentration $n = 1 \times 10^{18}/cm^3$), an undoped GaInAsP active layer 224a (thickness 0.1 μm), and a zinc-doped p-type indium phosphide cladding layer 225a (thickness 1.0 μm, carrier concentration $p = 1 \times 10^{18}/cm^3$), in that order from the side of the substrate 221a, thereby forming a double heterostructure. The side faces of this mesa stripe structure are {111} B planes. These various layers are grown by MOCVD techniques, maintaining the substrate temperature at approximately 650° C. and the pressure of the ambient area at approximately 50 torr, with a V/III ratio of 200.

Upon the semi-insulating $Ga_X In_{1-X} P_Y As_{1-Y}$ current blocking layer 222 are successively laminated a silicon-doped n-type indium phosphide cladding layer 223b, an undoped GaInAsP active layer 224b, and a zinc-doped p-type indium phosphide cladding layer 225b, in that order from the side of the substrate 221a.

A p-type indium phosphide burying layer 226 (thickness 5 μm, carrier concentration $p = 1 \times 10^{18}/cm^3$) is formed on the zinc-doped p-type indium phosphide layers 225a and 225b so as to cover the mesa stripe structure.

A zinc-doped p-type GaInAsP contact layer 227 (thickness 0.3 μm, carrier concentration $p = 1 \times 10^{19}/cm^3$) is formed over the p-type indium phosphide burying layer 226.

An Au/Zn electrode 228 is formed on the p-type GaInAsP contact layer 227, and an Au/Ge electrode 229 on the reverse face of the substrate 221.

The semiconductor laser device of the present embodiment also comprises a mesa stripe structure having {111} B facets as side faces. Consequently, the width of the active layer 224a in the semiconductor laser device of the present embodiment is subject to little statistical variation, and therefore the transverse oscillations of the emitted laser light can be restricted to the single fundamental mode, and moreover, the degree of nonuniformity among the characteristics of individual devices is slight.

In the semiconductor laser devices of the seventh and eighth embodiments described above, the substrate and various semiconductor layers can also be replaced by the same type of substrate and the same varieties of semiconductor layers as those employed in the present embodiment.

Thus, in the sixth through ninth embodiments described above, a mesa stripe structure is formed in a concave portion of the substrate, moreover, the multi-layer structure which is grown in the process of formation of the mesa stripe structure is also present above the area of the substrate other than the concave portion, thus providing the advantage of easy levelling of the wafer surface by the formation of the burying layer.

Furthermore, as regards the conductivity type of the various semiconductor layers, semiconductor materials with conductivity types opposite to those of the above embodiments can also be used.

Moreover, the channel can also be oriented in the [011] direction. That is, the direction of the channel could also be that represented by <011>.

Figure 13:
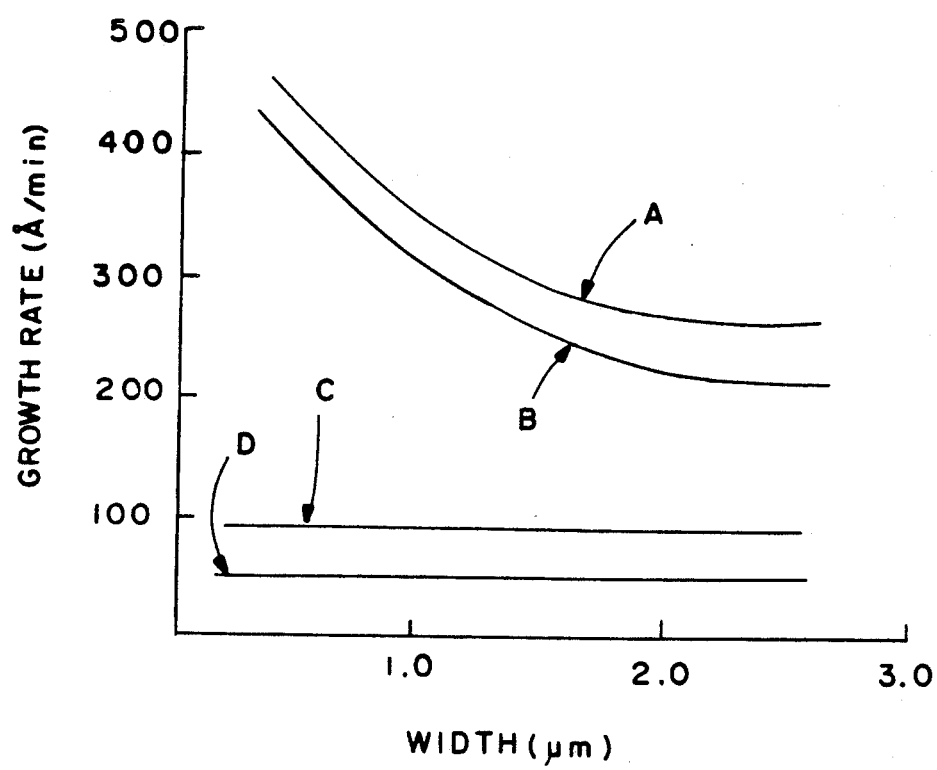
FIG. 13 is a graph showing the relations between growth rates of layers grown in a channel along the $[0\bar{1}1]$ direction and the width of the channel.

FIG. 13 shows representative graphs indicating the relations between the channel width (μm) and the rate of growth (angstroms/min) of crystal layers grown within the channel. The curves A, B, C, and D in the figure indicate the growth rates of an indium phosphide layer upon a (100) plane, a gallium arsenide layer upon a (100) plane, an indium phosphide or gallium arsenide layer upon a (111) B plane, and an indium phosphide or gallium arsenide layer upon a (111) A plane, respectively. By utilizing the plane orientation dependence of the growth rate, mesa stripe structures with prescribed widths can be formed with high precision.

Figure 14B:
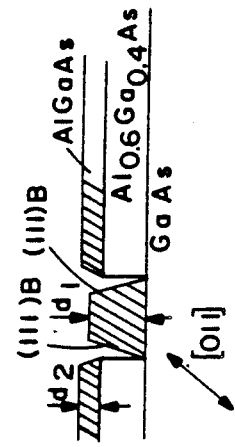
FIGS. 14B and 14D are schematic diagrams showing the cross-sections of the respective layers grown in a channel along the [011].
Figure 14A:
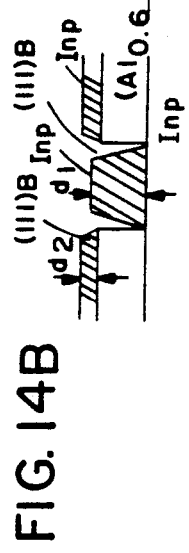
FIGS. 14A and 14C are graphs showing the relations between thicknesses of layers grown in a channel along the [011] direction and the corresponding growth time.
Figure 14D:
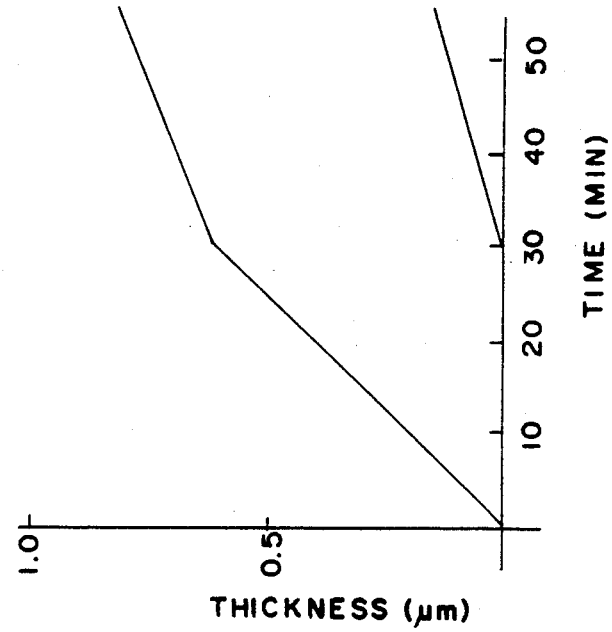
Figure 14C:
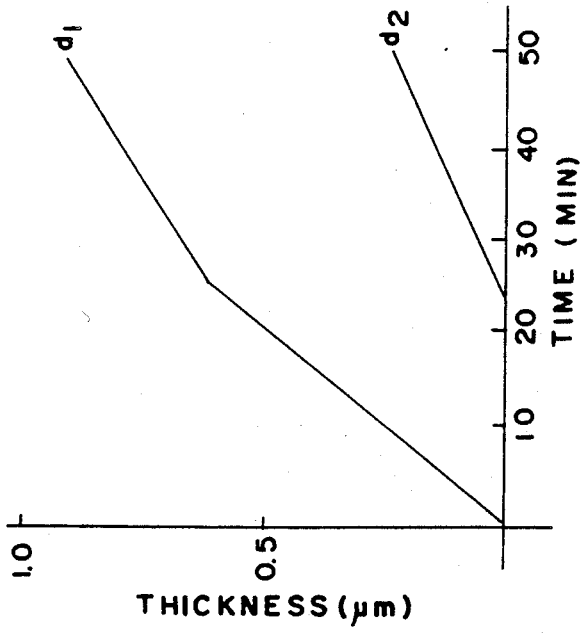

FIG. 14C shows the time dependence of the thickness of an AlGaAs layer grown upon a (001)-oriented gallium arsenide substrate initially covered by an AlGaAs layer with a channel running along the [011] direction. Growth was conducted by an MOCVD technique.

As seen from FIG. 14C, directly after the commencement of the growth, rapid formation of an AlGaAs layer is observed on the portion where the surface of the (100)-oriented gallium arsenide layer is exposed (i.e., the channel portion). On the other hand, one observes that no growth whatsoever occurs on the previously existing AlGaAs layer during the first 30 minutes of the process. This phenomenon was discovered by the present inventors.

The reason for this delay in commencement of growth of the AlGaAs layer over the pre-existing AlGaAs layer is as follows. When the AlGaAs layer is exposed to the air, the oxygen in the air combines with the aluminum and therefore an oxide film is prone to form on the exposed surface of the AlGaAs layer. If such an oxide film is present, then growth of a further AlGaAs layer over this film does not occur. However, since the hydrogen ions generated by decomposition of the arsine in the deposition gas reduce the oxide film formed on the original AlGaAs layer, the oxide film is gradually removed by reduction. Therefore, after the commencement of crystal growth, when the period of time required for the removal of the oxide film has elapsed, an AlGaAs layer begins to grow over the pre-existing AlGaAs layer. As seen from FIG. 14C, a period of 30 minutes was required for the removal of the oxide film by reduction in the experiments. On the other hand, almost no oxide film is formed on the surface of GaAs, since the latter contains no aluminum. Therefore, the formation of an AlGaAs layer on the gallium arsenide substrate within the channel begins directly after the initiation of the growth process.

At approximately the time when growth begins on the pre-existing AlGaAs layer, the rate of growth of the AlGaAs layer within the channel changes. The reason for this is as follows.

Under the conditions of the experiments, the rate of growth of the AlGaAs layer is determined by the content of organometallic compounds supplied to the growing surface of the AlGaAs layer from the deposition gas. Directly after the initiation of the growth process, the organometallic compounds are not consumed on the surface of the pre-existing AlGaAs layer, but diffuse rapidly within the channel. However, after the subsequent commencement of growth on the pre-existing AlGaAs layer, the quantity of organometallic compounds supplied within the channel decreases. Consequently, after the start of growth on the pre-existing AlGaAs layer, the rate of growth of the AlGaAs layer within the channel decreases.

FIG. 14A shows the time dependence of the thickness of an indium phosphide layer grown upon a (001)-oriented indium phosphide substrate initially covered by an AlGaInAs layer with a channel running along the [011] direction. The same phenomenon as that described above was also observed in this case. FIGS. 14B and 14D are schematic cross-sectional views of the respective grown layers.

Figure 15A:
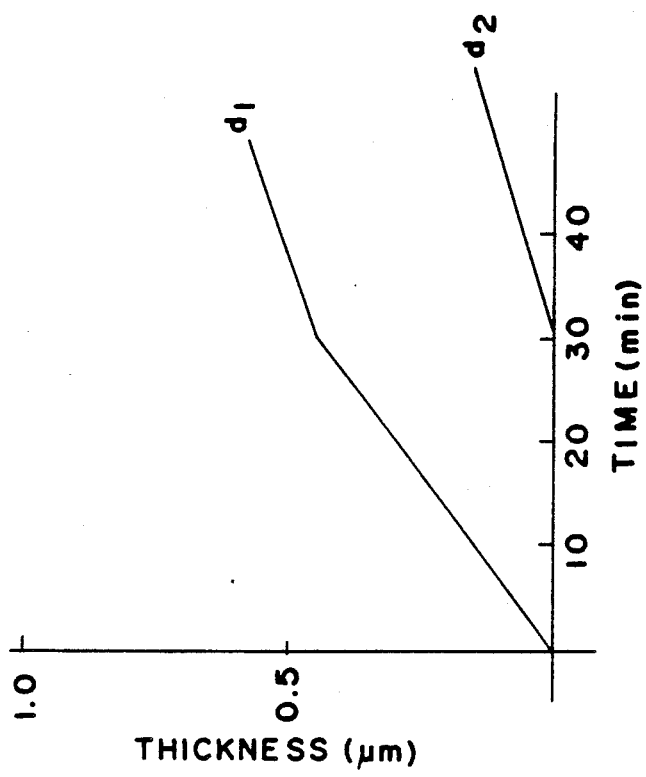
FIGS. 15A and 15C are graphs showing the relations between thicknesses of layers grown in a channel along that $[0\bar{1}1]$ direction and the corresponding growth time.
Figure 15B:
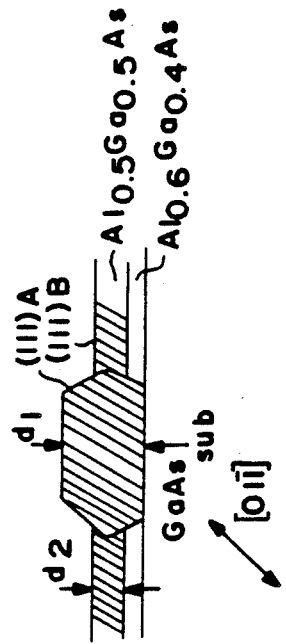
FIGS. 15B and 15D are schematic diagrams showing the cross-sections of the respective layers grown in a channel along the [011].
Figure 15C:
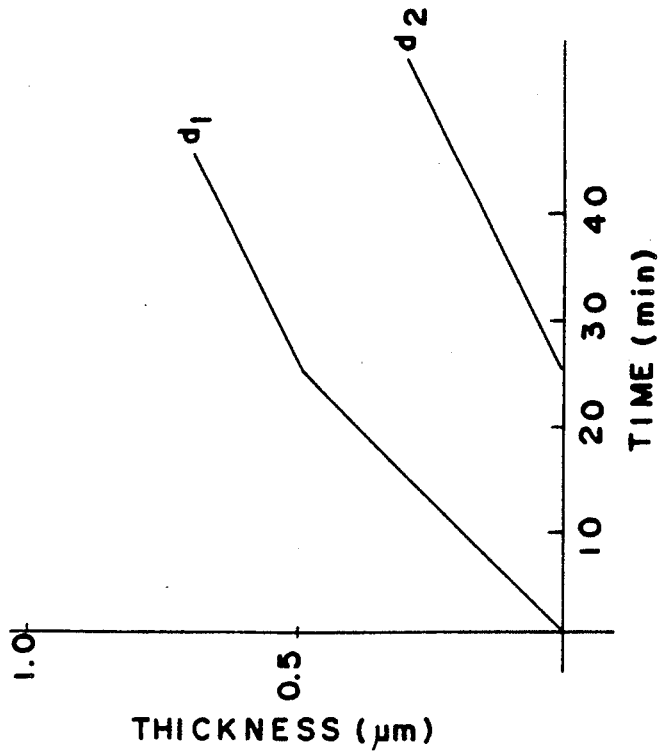
Figure 15D:
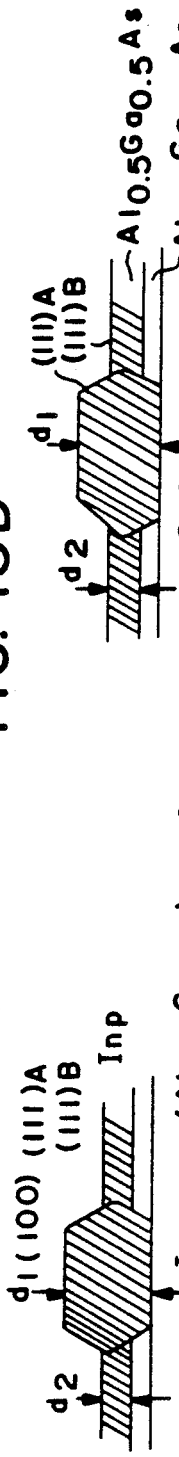

FIGS. 15A and 15C show the corresponding experimental results obtained when the direction of the channel was [01$\bar{1}$], while FIGS. 15B and 15D are schematic cross-sectional views of the respective grown layers.

As seen from FIGS. 15A and 15C, the above-described time dependence of the thickness of the grown layer was also observed in the present case. However, when the longitudinal direction of the channel is [01$\bar{1}$], the cross-sectional shape of the grown stripe is hexagonal.

Figure 16:
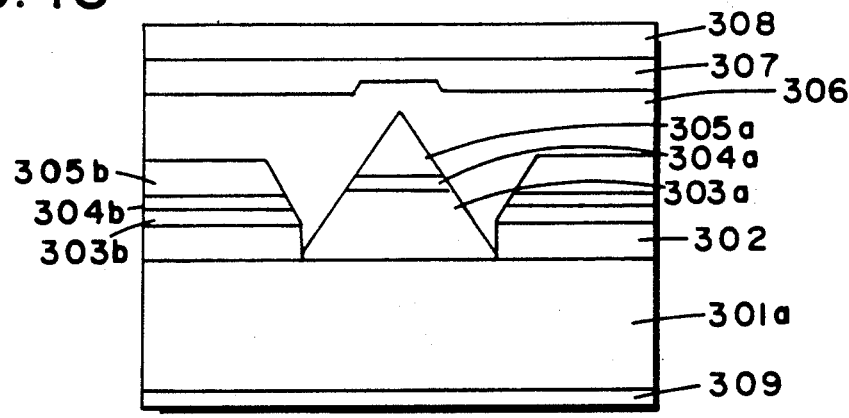
FIG. 16 is a cross-sectional view of a tenth embodiment of the present invention.

FIG. 16 shows a cross-sectional view of a tenth embodiment of the present invention. The semiconductor laser device of the present embodiment is of the same construction as that of the sixth embodiment (FIG. 8), except for the fact that the current blocking layer 302 in the present case is composed of a semiconductor containing aluminum (AlGaAs).

The process of fabrication of the semiconductor laser device shown in FIG. 16 will now be explained with reference to FIGS. 19A to 19D.

Figure 19A:
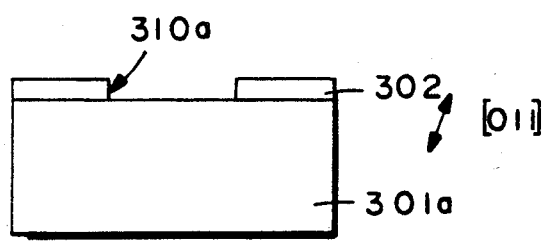
FIGS. 19A through 19D are cross-sectional views illustrating the process of fabrication of the tenth embodiment of the present invention.

First, a vanadium-doped semi-insulating $Al_XGa_{1-X}As$ layer current blocking layer 302 (X=0.3) was formed by an MOCVD technique over the (100)-oriented n-type gallium arsenide substrate 301a (a p-type AlGaAs layer could also be used as the blocking layer 302). Next, using a conventional photoetching process, a channel 310a of width 3 μm running along the [011] direction was formed in the semi-insulating AlGaAs current blocking layer 302 (FIG. 19A). Also, the etching conditions were adjusted so that the depth of the channel 310a reached the substrate 301a.

Figure 19B:
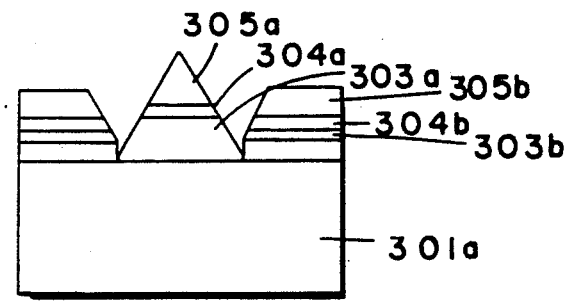

Next, by a selective growth process using an MOCVD method, a mesa stripe structure with a triangular cross-section was formed on the portion of surface of the substrate 301a within the channel 310a (FIG. 19B). In this crystal growth process, by appropriately regulating the gaseous species, etc., the n-type $Al_XGa_{1-X}As$ cladding layer 303a (X=0.5), the undoped AlGaAs active layer 304a, and the p-type $Al_XGa_{1-X}As$ cladding layer 305a (x=0.5) were continuously grown in that order from the side of the substrate 301a. During this growth process, the V/III ratio was 60, while the substrate temperature was maintained at approximately 750° C. and the pressure of the ambient area at approximately 76 torr. Under these growth conditions, the growth rate is subject to a plane orientation dependence which is such that crystal growth does not occur on {111} planes, and consequently {111} B facets were formed as the lateral faces of the mesa stripe structure as a result of the growth process. Thus, above the channel 310a running along the [011] direction, there was formed a mesa stripe structure with a triangular cross-section and with {111} B planes as the lateral faces running along the channel 310a.

Simultaneously, during the crystal growth process, an n-type $Al_XGa_{1-X}As$ cladding layer 303b (X=0.5), an undoped AlGaAs active layer 304b and a p-type $Al_XGa_{1-X}As$ cladding layer 305b (x=0.5), in that order from the side of the substrate 301a, were also continuously grown over the semi-insulating Al$_X$Ga$_{1-X}$As current blocking layer 302 (X=0.3).

Figure 19C:
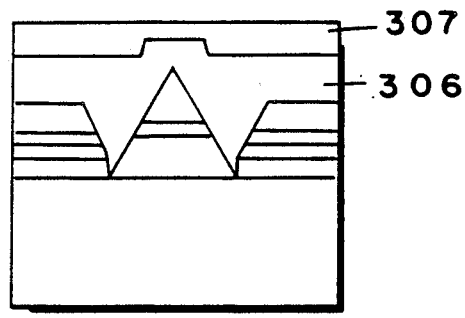
Figure 19D:
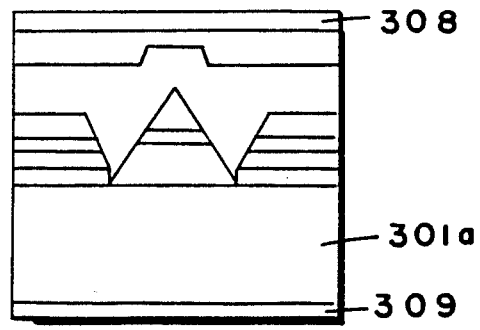

Next, a p-type Al$_X$Ga$_{1-X}$As burying layer 306 (X=0.5) and a zinc-doped p-type gallium arsenide contact layer 307 were successively grown so as to cover the mesa stripe structure and the p-type Al$_X$Ga$_{1-X}$As cladding layer 305b (FIG. 19C). During this crystal growth process, the ambient pressure was maintained at 760 torr. This crystal growth condition is nonselective with respect to crystal plane orientation. Therefore, the p-type AlGaAs burying layer 306 also grew on the lateral faces of the said mesa stripe structure, and consequently the resulting upper surface of the p-type AlGaAs burying layer 306 was levelled.

In the present embodiment, the selective growth process used for the formation of the mesa stripe structure as well as the nonselective growth process used for the formation of the burying layer were performed continuously within one and the same MOCVD apparatus, without contact between the wafer and the external atmosphere.

Finally, an Au/Zn electrode 308 was formed over the level upper surface of the p-type gallium arsenide layer 307, and an Au/Ge electrode 309 was formed on the reverse face of the substrate 301a (FIG. 19D), thereby completing the fabrication of the semiconductor laser device of FIG. 16.

Figure 17:
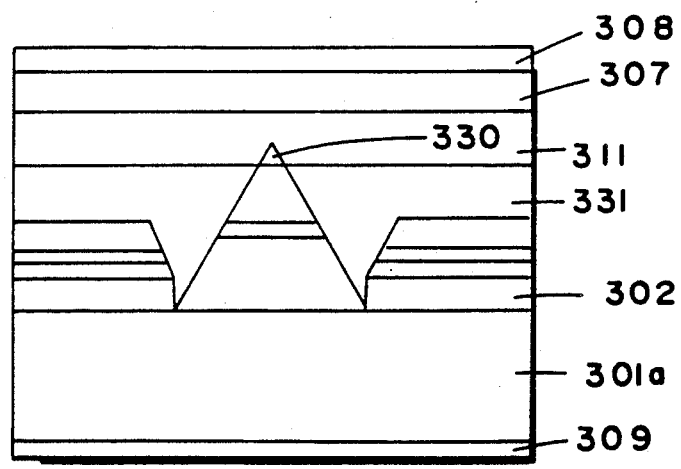
FIG. 17 is a cross-sectional view of an eleventh embodiment of the present invention.

FIG. 17 illustrates an eleventh embodiment of the present invention. After forming a mesa stripe structure by the same procedure as that used in the tenth embodiment, a semi-insulating AlGaAs burying layer 331 was formed. This growth process was conducted in such a manner that the burying layer 331 did not rise above the apex of the mesa stripe structure. In order to ensure that the height of the burying layer 331 did not exceed that of the apex, a p-type AlGaAs layer 330 was added to the apical portion of the mesa stripe structure. Since the rate of growth of the burying layer 331 on this p-type AlGaAs layer 330 is small, this serves to prevent the growth of the burying layer 331 beyond the level of the apex. Also, since this p-type AlGaAs layer 330 is selectively grown on the apical portion of the mesa stripe structure, appreciable growth of this layer does not occur on any area other than the said apical portion. A p-type cladding layer 311 is then formed so as to make contact with the apex.

Figure 18:
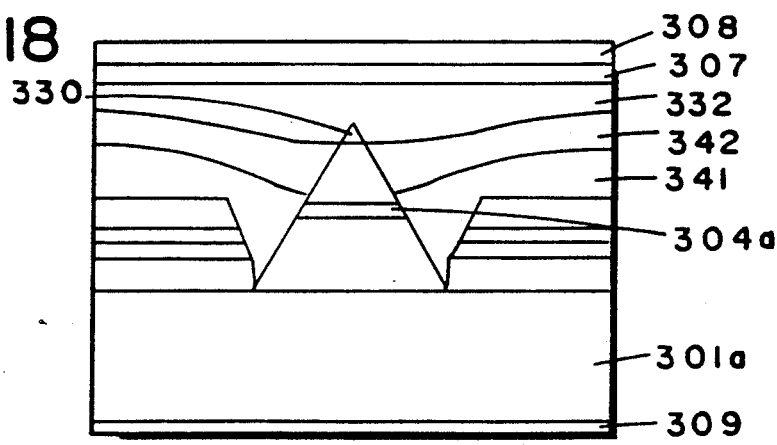
FIG. 18 is a cross-sectional view of a twelfth embodiment of the present invention.

FIG. 18 illustrates a twelfth embodiment. In the present embodiment, a p-type AlGaAs layer 341 and an n-type AlGaAs layer 342 are successively and continuously formed to serve jointly as the burying layer. Thus, a p-n junction is formed within the burying layer. Then, a p-type AlGaAs cladding layer 332 is formed so as to make contact with the apical portion of the mesa stripe structure.

Figure 20:
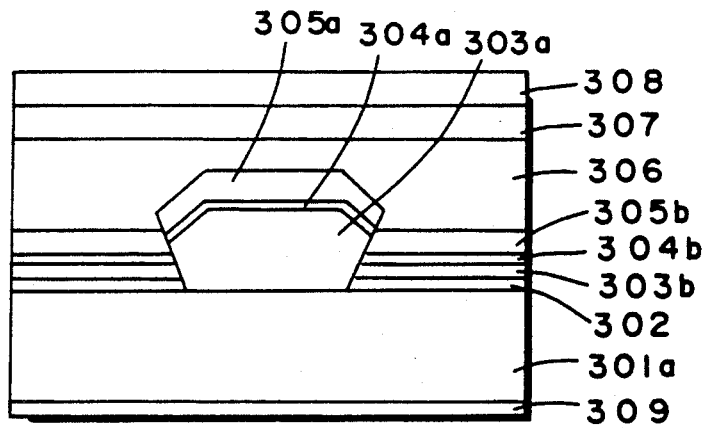
FIG. 20 is a cross-sectional view of a thirteenth embodiment of the present invention.

FIG. 20 illustrates a thirteenth embodiment. The principal difference between the present embodiment and the above-described tenth embodiment consists in the fact that in the present case the channel was oriented in the [01$\bar{1}$] direction. Consequently, the cross-section of the mesa stripe in the present embodiment is hexagonal.

Figure 21A:
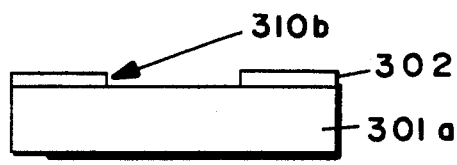
FIGS. 21A through 21C are cross-sectional views illustrating the process of fabrication of the thirteenth embodiment of the present invention.

The process of fabrication of the present embodiment will now be explained with reference to FIGS. 21A through 21C. First, the vanadium-doped semi-insulating Al$_X$Ga$_{1-X}$As current blocking layer 302 (X=0.3) was formed by an MOCVD technique over the (100)-oriented n-type gallium arsenide substrate 301a. Next, using a conventional photoetching process, a channel 310b of width 3 μm running along the [01$\bar{1}$] direction was formed in the said semi-insulating AlGaAs current blocking layer 302 (FIG. 21A).

Figure 21B:
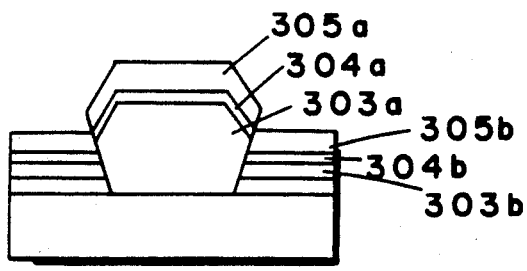
Figure 21C:
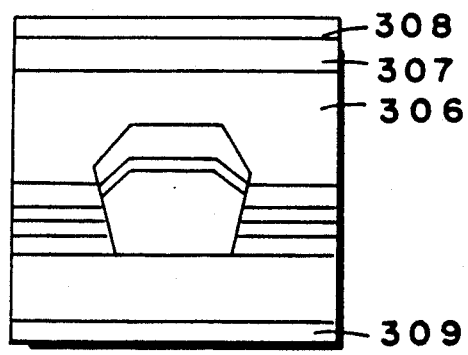

Next, by a selective growth process using the MOCVD method, a mesa stripe structure with a hexagonal cross-section was formed on the portion of the surface of the substrate 301a within the channel 310b (FIG. 21B). In this crystal growth process, by appropriately regulating the gaseous species, etc., the n-type Al$_X$Ga$_{1-X}$As cladding layer 303a (X=0.5), the undoped AlGaAs active layer 304a, and the p-type Al$_X$Ga$_{1-X}$As cladding layer 305a (X=0.5) were continuously grown in that order from the side of the substrate 301a. Under the growth conditions used in this process, the growth rate is subject to a plane orientation dependence which is such that crystal growth does not occur on {111} planes, and consequently {111} B facets were formed as the lateral faces of the mesa stripe structure as a result of the growth process. Thus, above the channel 310b running along the [011] direction, there was formed a mesa stripe structure with a hexagonal cross-section and with {111} B planes as the side faces running along the channel 310b.

Next, a p-type Al$_X$Ga$_{1-X}$As burying layer 306 (X=0.5) and a zinc-doped p-type gallium arsenide contact layer 307 were successively grown so as to cover the said mesa stripe structure and the p-type Al$_X$Ga$_{1-X}$As cladding layer 305b. During this crystal growth process, the ambient pressure was maintained at 760 torr. The crystal growth condition is nonselective with respect to crystal plane orientation. Therefore, the p-type AlGaAs burying layer 306 also grew on the side faces of the mesa stripe structure, and consequently the resulting upper surface of the p-type AlGaAs burying layer 306 was level.

An Au/Zn electrode 308 was formed over the level upper surface of the p-type gallium arsenide layer 307 and an Au/Ge electrode 309 was formed on the reverse face of the substrate 301a (FIG. 21C), thereby completing the fabrication of the semiconductor laser device of FIG. 20.

Figure 22:
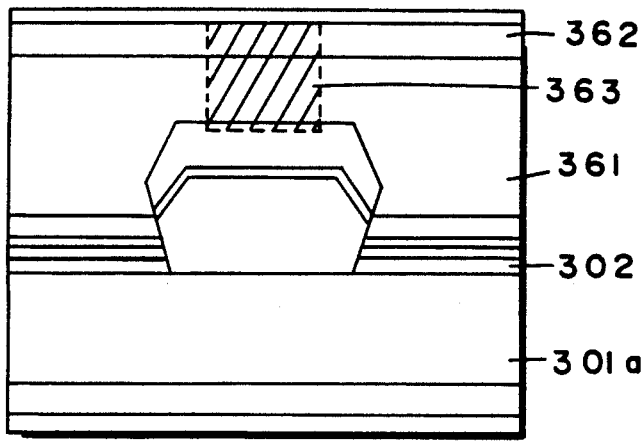
FIG. 22 is a cross-sectional view of a fourteenth embodiment of the present invention.

FIG. 22 illustrates a fourteenth embodiment. After the formation of a mesa stripe structure, a semi-insulating AlGaAs layer 361 and an n-type AlGaAs contact layer 362 are successively laminated upon the structure. Then, a zinc diffusion zone 363 is formed, extending down to the cladding layer through the contact layer 362. In the present embodiment, since the semi-insulating AlGaAs layer 361 is used as part of the burying layer, either a semi-insulating, p-type, or n-type semiconductor layer can be used as the current blocking layer 302. Also, an n-type AlGaAs layer can be used in place of the semi-insulating AlGaAs layer 361.

Figure 23:
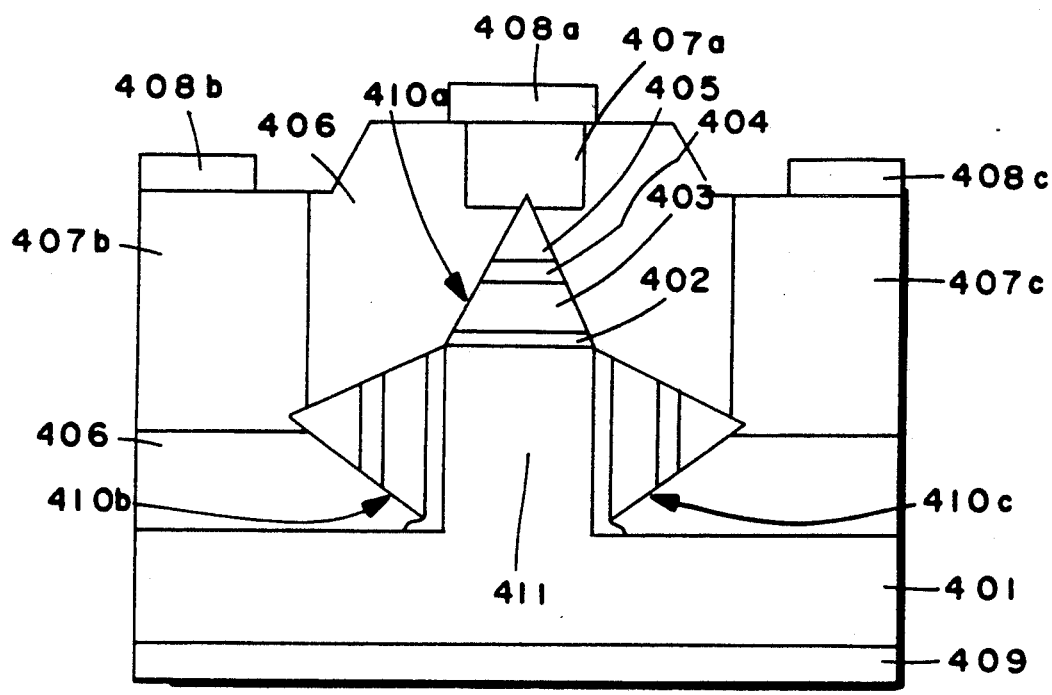
FIG. 23 is a cross-sectional view of a fifteenth embodiment of the present invention.

FIG. 23 shows a cross-sectional view of a fifteenth embodiment of the present invention. A stripe-like ridge structure 411 (width 3 μm, height 3.2 μm) is formed in the [011] direction (resonator direction, perpendicular to the plane of the Figure) over the upper surface of a (100)-oriented n-type gallium arsenide substrate 401.

On the upper surface of this ridge 411 is formed a first multilayer structure 410a, with a triangular cross-section, while on the two side faces of the ridge structure 411 are formed a second multilayer structure 410b and a third multilayer structure 410c, both with triangular cross-sections. Each of the three multilayer structures 410a, 410b, and 410c is composed of a selenium-doped n-type gallium arsenide buffer layer 402 of thickness 1

μm, a selenium-doped n-type $Al_{0.4}Ga_{0.6}As$ cladding layer 403 of thickness 0.8 μm, an undoped $Al_{0.13}Ga_{0.87}As$ active layer 404 of thickness 0.1 μm, and a zinc-doped p-type $Al_{0.4}Ga_{0.6}As$ cladding layer 405 of thickness 0.8 μm, laminated in that order from the surfaces of the ridge structure 411. Thus, a first double heterostructure containing an active layer 404 parallel to the main surface of the substrate 401 as well as a second and a third double heterostructure containing respective active layers 404 perpendicular to the main surface of the substrate are all formed over one and the same substrate 401.

The multilayer structures 410a, 410b, and 410c are covered by a burying layer 406. Within the burying layer 406, above the first multilayer structure 410a, an impurity diffusion zone 407a is formed so as to provide electrical contact between the p-type cladding layer 405 of the first multilayer structure 410a and the first p-terminal electrode 408a. Also, within the burying layer 406, above the second multilayer structure 410b, an impurity diffusion zone 407b is formed so as to provide electrical contact between the p-type cladding layer 405 of the second multilayer structure 410b and the second p-terminal electrode 408b. Similarly, within the burying layer 406, above the third multilayer structure 410c, an impurity diffusion zone 407c is formed so as to provide electrical contact between the p-type cladding layer 405 of the third multilayer structure 410c and the third p-terminal electrode 408c. There is no mutual contact among the said three impurity zones 407a, 407b, and 407c.

A first stripe-shaped p-terminal electrode 408a is located above the impurity diffusion zone 407a of the burying layer 406 in apposition to the upper face of the ridge structure 411. Also, a second stripe-shaped p-terminal electrode 408b is located above the impurity diffusion zone 407b and parallel to the first p-terminal electrode 408a, similarly, a third stripe-shaped p-terminal electrode 408c is located above the impurity diffusion zone 407c and parallel to the first p-terminal electrode 408a. An n-terminal electrode 409 is formed over the entire reverse face of the substrate 401.

If a voltage is applied upon the first p-terminal electrode 408a and the n-terminal electrode 409, a driving current flows within the first multilayer structure 410a. This induces laser oscillations in the single transverse mode, and this laser light is emitted from the end surface of the first multilayer structure 410a. The direction of polarization of the laser light so emitted is parallel to the main surface of the substrate 401.

Moreover, if a voltage is applied upon the second p-terminal electrode 408b and the n-terminal electrode 409, the driving current flows within the second multilayer structure 410b. This induces the laser oscillations in the single transverse mode, and this laser light is emitted from the end surface of the second multilayer structure 410b. The direction of polarization of the laser light so emitted is perpendicular to the main surface of the substrate 401.

Similarly, if a voltage is applied upon the third p-terminal electrode 408c and the n-terminal electrode 409, the driving current flows within the third multilayer structure 410c. This induces the laser oscillations in the single transverse mode, and this laser light is emitted from the end surface of the third multilayer structure 410c. The direction of polarization of the laser light so emitted is also perpendicular to the main surface of the substrate 401.

Thus, in the semiconductor laser device of the present embodiment, the direction of polarization of the laser light emitted from the first multilayer structure 410a is perpendicular to the directions of polarization of the laser light emitted from the second and third multilayer structures 410b and 410c.

Thus, by appropriately adjusting the respective voltages applied upon the first, second, and third p-terminal electrodes 408a, 408b, and 408c, respectively, two varieties of laser light with different directions of polarization can be emitted either simultaneously or at different times.

Therefore, using the semiconductor laser devices of the present invention, two varieties of laser light with directions of polarization differing by 90° can be emitted from a single semiconductor laser device, which facilitates the miniaturization and reduction of the number of components required in optical measuring instruments.

Figure 24A:
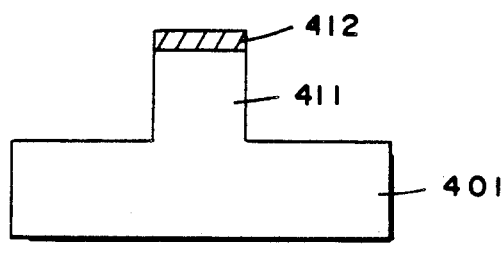
FIGS. 24A through 24F are cross-sectional views illustrating the process of fabrication of the fifteenth embodiment of the present invention.

Next, a method of fabrication of the semiconductor laser device illustrated in FIG. 23 will be explained with reference to FIGS. 24A through 24F. First, a stripe-shaped photoresist mask 412 of width 3 μm, running along the [011] direction, was formed on a (100)-oriented n-type gallium aresenide substrate 401. Next, the ridge structure 411 of width 3 μm, running along the [011] direction, was formed on the substrate 401 by an etching process using a sulfuric acid type etchant ($H_2SO_4$: $H_2O_2$: $H_2O = 1:2:10$)(FIG. 24A). Also, the etching conditions were adjusted so that the height of the ridge structure 411 was of the same order as the width of the said ridge structure 411.

Figure 24B:
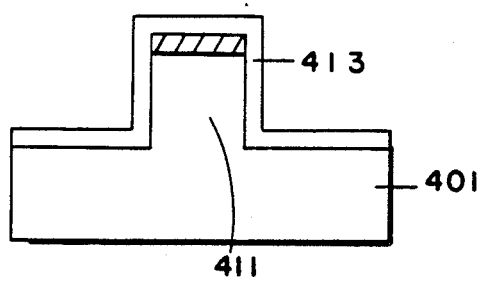

Then, using a plasma CVD method, a silica film 413 was formed over the surface of the photoresist mask 412 on the ridge structure 411 as well as the entire upper surface of the substrate 401, including the lateral faces of the ridge structure 411 (FIG. 24B).

Figure 24C:
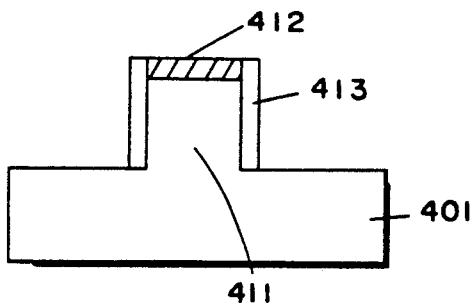

Next, in order to etch the silica film 413, an argon ion beam was directed toward the surface of the substrate 401 from an ion beam source above the substrate. The direction of the ion beam in this process was perpendicular to the main upper surface of the substrate 401. Since the ion beam did not impinge upon the portion of the silicon film 413 formed on the side faces of the ridge structure 411, this portion of the silicon film 413 was not etched. The other portions of the silicon film 413 were bombarded by the ion beam and thereby etched away. Thus, after this etching process, the upper surface of the ridge structure 411 was still covered by the photoresist mask 412, while the side faces of the ridge 411 remained covered by the silica film 413 (FIG. 24C).

Figure 24D:
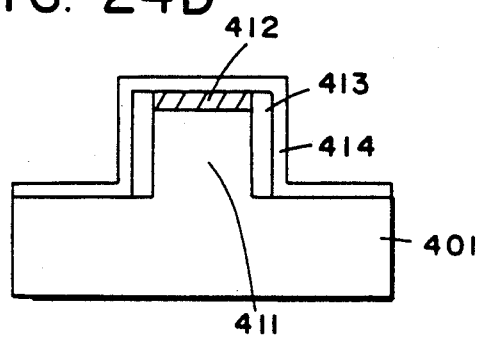

Next, using a plasma CVD method, a trisilicon tetranitride film 414 was formed over the surface of the photoresist mask 412 as well as the entire upper surface of the substrate 401, including the side faces of the ridge structure 411 (FIG. 24D).

Figure 24E:
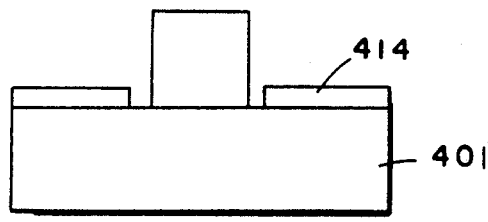

Next, the photoresist mask 412 was removed from the substrate 401 by cleaning with an organic solvent, and also the silica film 413 was removed by immersing the substrate 401 in a hydrofluoric acid solution (FIG. 24E). By this means, the portion of the trisilicon tetranitride film 414 overlaying the photoresist mask 412 and the silica film 413 (FIG. 24E) was also lifted off.

Figure 24F:
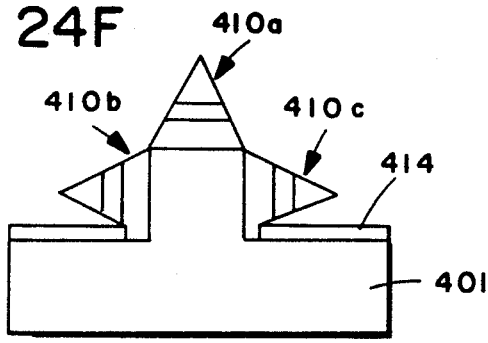

Then, using MOCVD techniques, an n-type gallium arsenide buffer layer 402, an n-type $Al_{0.4}Ga_{0.6}As$ cladding layer 403, an undoped $Al_{0.13}Ga_{0.87}As$ active layer 404, and a p-type $Al_{0.4}Ga_{0.6}As$ cladding layer 405, in that order, were successively laminated upon the substrate 401. However, during this process, crystal growth of the various layers did not occur on the non-crystalline trisilicon tetranitride film 414. Also, the crystal growth conditions were so adjusted that almost no growth occurred on {111} planes. As a result, multilayer structures were formed only on the upper and side surfaces of the ridge structure 411, moreover, {111} facets were formed on these multilayer structures. Consequently, the cross-sections of the respective multilayer structures were triangular (FIG. 24F).

In this manner, the first multilayer structure 410a, containing an active layer 404 parallel to the main face of the substrate 401, as well as the second and third multilayer structures 410b and 410c, containing active layers 404 perpendicular to the main face of the substrate 401, were formed by one and same process.

Next, the trisilicon tetranitride film 414 was removed with a mixed solution of ammonium hydroxide and hydrofluoric acid, after which the vanadium-doped semi-insulating gallium arsenide burying layer 406 was formed on the entire surface of the substrate 401 so as to completely cover the multilayer structures 410a, 410b, and 410c.

Then, by doping a prescribed region of the burying layer 406 with zinc, an impurity diffusion zone 407a was formed above the first multilayer structure 410a for the purpose of electrically connecting the p-type cladding layer 405 of the first multilayer structure 410a with the first p-terminal electrode 408a. Similarly, an impurity diffusion zone 407b was formed above the second multilayer structure 410b for the purpose of electrically connecting the p-type cladding layer 405 of the second multilayer structure 410b with the second p-terminal electrode 408b. Likewise, an impurity diffusion zone 407c was formed above the third multilayer structure 410c for the purpose of electrically connecting the p-type cladding layer 405 of the third multilayer structure 410c with the first p-terminal electrode 408c.

The first stripe-shaped p-terminal electrode 408a was formed above the impurity diffusion zone 407a of the burying layer 406, in apposition to the upper face of the ridge structure 411. Also, the second stripe-shaped p-terminal electrode 408b was formed above the impurity diffusion zone 407b of the burying layer 406 and parallel to the first p-terminal electrode 408a, similarly, the third stripe-shaped p-terminal electrode 408c was formed above the impurity diffusion zone 407c of the burying layer 406 and parallel to the first p-terminal electrode 408a.

An n-terminal electrode 409 was then formed over the entire reverse face of the substrate 401, thereby completing the fabrication of the semiconductor laser device illustrated in FIG. 23.

Thus, in the present embodiment, using MOCVD techniques, selective growth of the semiconductor layers was effected under conditions such that crystal growth on {111} planes was diffcult, thereby permitting the simultaneous formation of multilayer structures with triangular cross-sections on the upper surface as well as the two side faces of the ridge structure 411.

Figure 25:
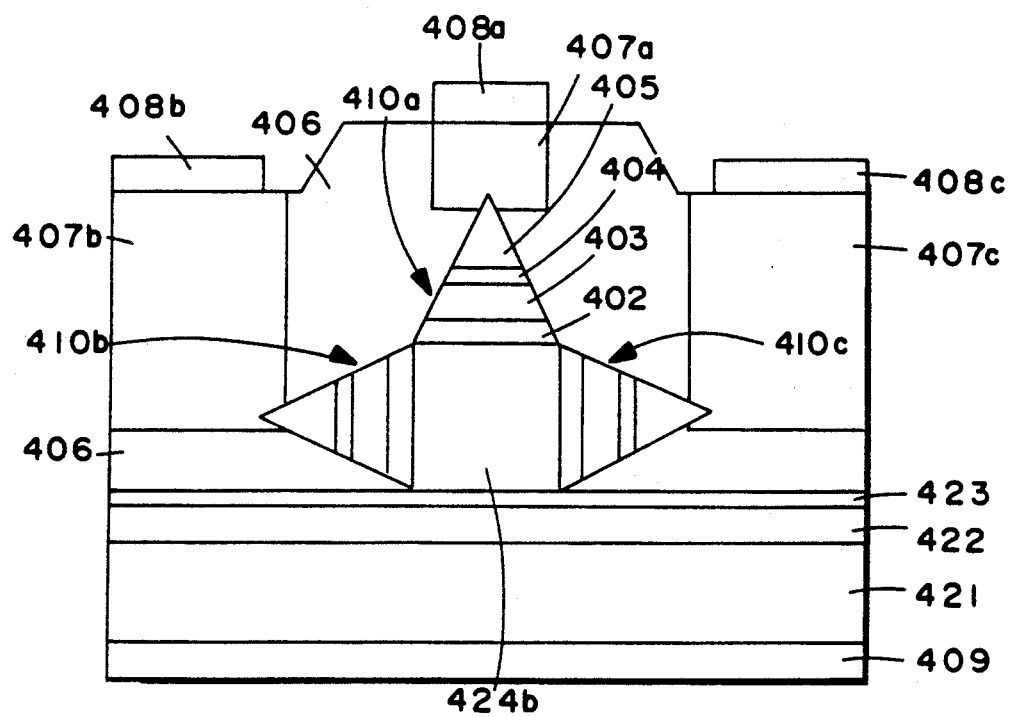
FIG. 25 is a cross-sectional view of a sixteenth embodiment of the present invention.

Next, a sixteenth embodiment will be explained with reference to FIG. 25. In the semiconductor laser device of the present embodiment, a selenium-doped n-type gallium arsenide buffer layer 422 of thickness 1 μm and a selenium-doped n-type $Al_{0.5}Ga_{0.5}As$ growth-inhibiting layer 423 of thickness 0.2 μm are successively laminated over the upper surface of a (100)-oriented n-type gallium arsenide substrate 421.

Above the n-type $Al_{0.5}Ga_{0.5}As$ growth-inhibiting layer 423 lies a stripe-like ridge 424b of width 5 μm and height 3 μm, running in the [011] direction (resonator direction, perpendicular to the plane of the Figure).

On the upper face of the ridge structure 424b is a first multilayer structure 410a with a triangular cross-section, while a second multilayer structure 410b and a third multilayer structure 410c, both with triangular structures, are located upon the two respective side faces of the said ridge structure 424b. Each of the three multilayer structures 410a, 410b, and 410c is composed of a selenium-doped n-type gallium arsenide buffer layer 402 of thickness 1 μm, a selenium-doped n-type $Al_{0.4}Ga_{0.6}As$ cladding layer 403 of thickness 0.8 μm, an undoped $Al_{0.13}Ga_{0.87}As$ active layer 404 of thickness 0.1 μm, and a zinc-doped p-type $Al_{0.4}Ga_{0.6}As$ cladding layer 405 of thickness 0.8 μm, successively laminated, in that order, over the surfaces of the ridge structure 424b.

Thus, a first double heterostructure including an active layer 404 parallel to the main upper surface of the substrate 421 as well as a second and a third double heterostructure including the active layers 404 perpendicular to the main upper surface of the substrate 421 are formed over one and the same substrate.

The multilayer structures 410a, 410b, and 410c are covered by the burying layer 406. Within the burying layer 406, an impurity diffusion zone 407a is formed so as to provide electrical contact between the p-type cladding layer 405 of the first multilayer structure 410a and the first p-terminal electrode 408a. Also, within the burying layer 406, above the second multilayer structure 410b, an impurity diffusion zone 407b is formed so as to provide electrical contact between the p-type cladding layer 405 of the second multilayer structure 410b and the second p-terminal electrode 408b. Similarly, within the burying layer 406, above the third multilayer structure 410c, an impurity diffusion zone 407c is formed so as to provide electrical contact between the p-type cladding layer 405 of the third multilayer structure 410c and the thrid p-terminal electrode 408c. There is no mutual contact among the said three impurity zones 407a, 407b, and 407c.

The first stripe-shaped p-terminal electrode 408a is located above the impurity diffusion zone 407a of the burying layer 406 in apposition to the upper face of the ridge structure 424b. Also, the second stripe-shaped p-terminal electrode 408b is located above the impurity diffusion zone 407b and parallel to the first p-terminal electrode 408a, similarly, the third stripe-shaped p-terminal electrode 408c is locationed above the impurity diffusion zone 407c and parallel to the first p-terminal electrode 408a. An n-terminal electrode 409 is formed over the entire reverse face of the substrate 421.

Figure 26A:
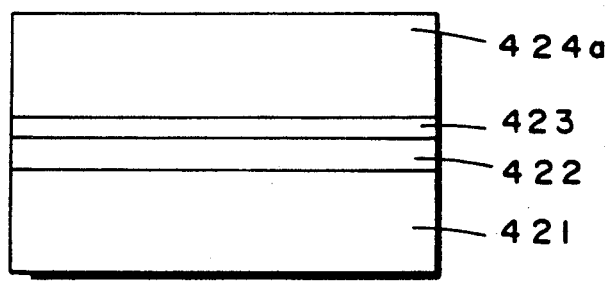
FIGS. 26A and 26B are cross-sectional views illustrating the process of fabrication of the sixteenth embodiment of the present invention.
Figure 26B:
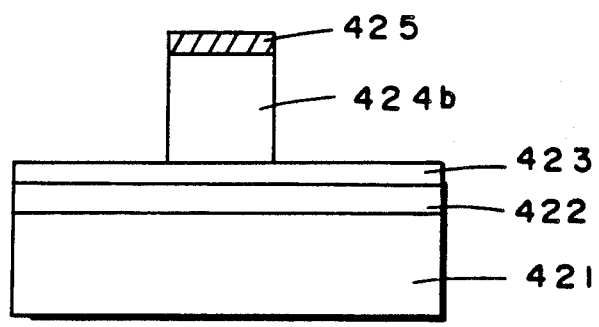

Next, a method of fabrication of the semiconductor laser device of the present embodiment will be explained with reference to FIGS. 26A through 26B. First, using MOCVD techniques, the n-type gallium arsenide buffer layer 422, the n-type $Al_{0.5}Ga_{0.5}As$ growth-inhibiting layer 423, and the selenium-doped n-type gallium arsenide layer 424a of thickness 3 μm were successively grown over a (100)-oriented n-type gallium arsenide substrate 421 (FIG. 26A).

Next, a stripe-shaped photoresists mask 425 of width 3 μm, running along the [011] direction, was formed on the selenium-doped n-type gallium arsenide substrate 424a. Then, the ridge structure 424b of width 5 μm, running along the [011] direction, was formed from the selenium-doped gallium arsenide layer 424a by an etching process using a sulfric acid type etchant ($H_2SO_4$: $H_2O_2$: $H_2O = 1:2:10$) (FIG. 26B). The etching was continued until the upper surface of the n-type $Al_{0.5}Ga_{0.5}As$ growth-inhibiting layer 423 was exposed.

Next, the photoresist mask 425 was removed by cleaning with an organic solvent, after which, as in the embodiment described above, MOCVD techniques were used to successively superimpose the n-type gallium arsenide buffer layer 402, the n-type $Al_{0.4}Ga_{0.6}As$ cladding layer 403, the undoped $Al_{0.13}Ga_{0.87}As$ active layer 404, and the p-type $Al_{0.4}Ga_{0.6}As$ cladding layer 405, in that order. However, during this process, crystal growth of the various aforesaid layers did not occur on the n-type $Al_{0.5}Ga_{0.5}As$ growth-inhibiting layer 423. Other semiconductor materials represented by the formula $Al_XGa_{1-X}As$ ($0.5 \leq X \leq 0.7$) could also be used to form the growth-inhibiting layer for the present purpose.

Also, as in the fifteenth embodiment, the crystal growth conditions were adjusted so that almost no crystal growth occurred on {111} planes.

Consequently, multilayer structures were formed only on the upper and two side faces of the ridge structure 424b, moreover, {111} facets were formed on these multilayer structures, and the cross-section of each of the multilayer structures so formed was triangular.

Subsequently, the burying layer 406 as well as the electrodes 408a, 408b, 408c, and 409, etc., are formed, thereby completing the fabrication of the semiconductor laser device illustrated in FIG. 26.

Figure 27:
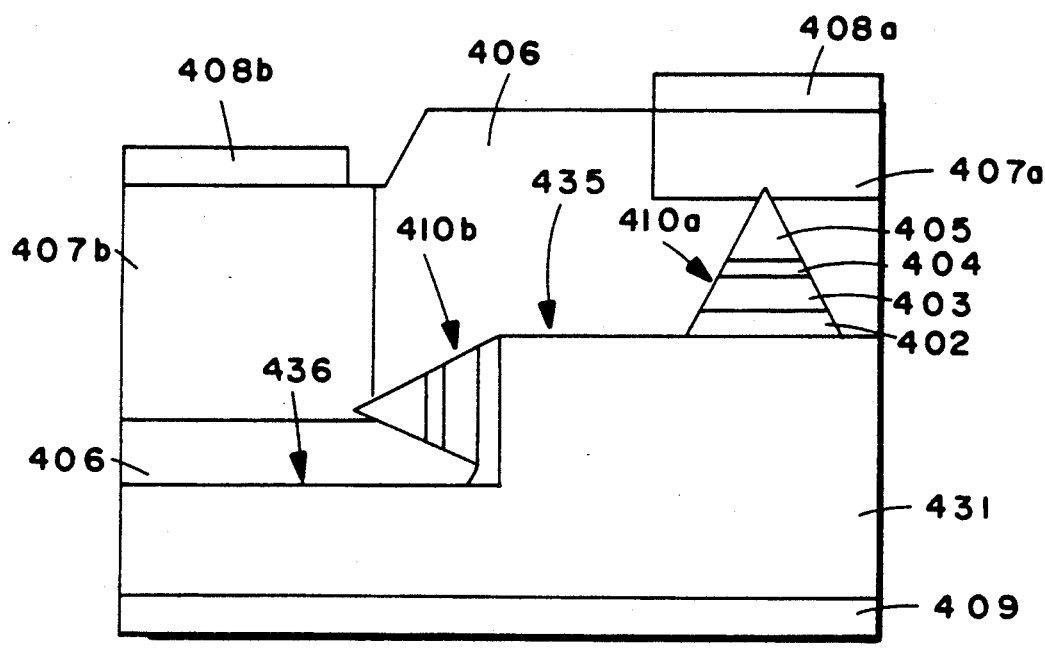
FIG. 27 is a cross-sectional view of a seventeenth embodiment of the present invention.

Next, a seventeenth embodiment will be explained with reference to FIG. 27. A terrace structure of height 3.2 μm is formed on the upper surface of a (100)-oriented n-type gallium arsenide substrate 431, with the lateral face of the escarpment of this terrace running along the [011] direction (resonator direction, perpendicular to the plane of the Figure). The escarpment of this terrace structure divides the main surface of the substrate 431 into an upper level 435 and a lower level 436.

A first stripe-like multilayer structure 410a with a triangular cross-section is situated on a portion of the area of the upper level 435 of the said terrace structure, while a second stripe-like multilayer structure 410b with a triangular cross-section is located on the side face of the escarpment of the terrace structure. Each of these multilayer structures, as in the previously described embodiment, is composed of a selenium-doped n-type gallium arsenide buffer layer 402 of thickness 1 μm, a selenium-doped n-type $Al_{0.4}Ga_{0.6}As$ cladding layer 403 of thickness 0.8 μm, an undoped $Al_{0.13}Ga_{0.87}As$ active layer 404 of thickness 0.1 μm, and a zinc-doped p-type $Al_{0.4}Ga_{0.6}As$ cladding layer 405 of thickness 0.8 μm, successively laminated, in that order, from the side of the substrate 431.

Thus, a first double heterostructure including the active layer 404 parallel to the main surface of the substrate 431 as well as a second heterostructure including the active layer 404 perpendicular to the main surface of the substrate are both formed over one and the same substrate.

The mulitlayer structures 410a and 410b are covered by a burying layer 406. Within the burying layer 406, above the first multilayer structure 410a, an impurity diffusion zone 407a is formed so as to provide electrical contact between the p-type cladding layer 405 of the first multilayer structure 410a and the first p-terminal electrode 408a. Also, within the burying layer 406, above the second multilayer structure 410b, an impurity diffusion zone 407b is formed so as to provide electrical contact between the p-type cladding layer 405 of the second multilayer structure 410b and the second p-terminal electrode 408b. There is no mutual contact between the said two impurity zones 407a and 407b.

The first stripe-shaped p-terminal electrode 408a is located above the impurity diffusion zone 407a of the burying layer 406 in apposition to the upper level of the terrace structure. Also, the second stripe-shaped p-terminal electrode 408b is located above the impurity diffusion zone 407b and parallel to the first p-terminal electrode 408a. An n-terminal electrode 409 is formed over the entire reverse face of the substrate 401.

Figure 28A:
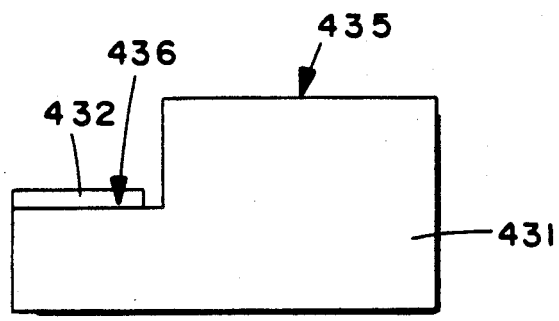
FIGS. 28A through 28C are cross-sectional views illustrating the process of fabrication of the seventeenth embodiment of the present invention.

Next, the method of fabrication of the present embodiment will be explained with reference to FIGS. 28A through 28C. First, by etching the substrate 431 with a conventional etching technique, a terrace structure with the side face of the escarpment running along the [011] direction was formed, then, by the same method as that indicated in the above description of the fourteenth embodiment, a trisilicon tetranitride film 432 was formed only on a lower level 436 of the terrace structure on the said substrate 431 (FIG. 28A).

Figure 28B:
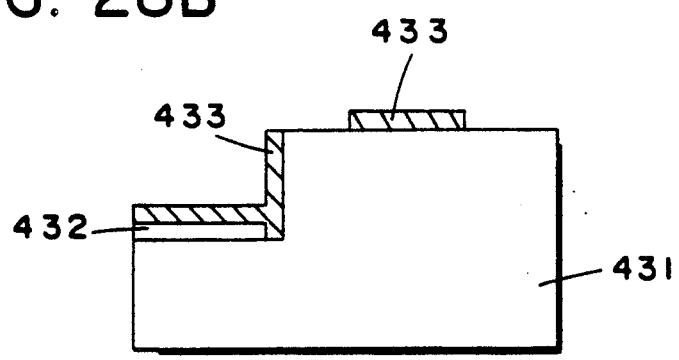

Then, resist masks 433 were formed on the trisilicon tetranitride film 432 and the lateral face of the escarpment of the terrace structure as well as on the stripe-shaped area upon which the first multilayer structure 410a was to be formed (FIG. 28B).

Figure 28C:
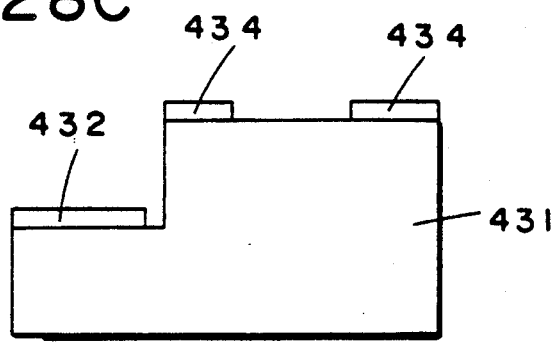

Next, a trisilicon tetranitride film 434 was formed over the entire substrate 431, after which a lift-off method was used to remove the said trisilicon tetranitride film 434 from the lateral face of the escarpment of the terrace structure as well as the stripe-shaped area on the upper level 435 upon which the first multilayer structure 410a was to be formed (FIG. 28C).

Subsequently, the first and second multilayer structures, etc., were formed by the same processes as those indicated in the above description of the fifteenth embodiment, thereby completing the fabrication of the semiconductor laser device illustrated by FIG. 27.

In the present embodiment, the first multilayer structure 410a was formed on an area at some distance removed from the side face of the escarpment of the terrace structure. This permitted the effective mutual electrical isolation of the first and second p-terminal electrodes by appropriately increasing the distance between the first and second multilayer structures, 410a and 410b.

In the present embodiment also, the direction of polarization of the laser light emitted from the first multilayer structure 410a is perpendicular to the direction of polarization of the laser light emitted from the second multilayer structure 410b. Thus, by appropriately regulating the respective voltages impressed upon the first and second p-terminal electrodes 408a and 408b, respectively, two varieties of laser light with different directions of polarization can be emitted either simultaneously or at different times.

Moreover, although both of the aforesaid embodiments were explained with reference to [011] as the lengthwise direction of the lateral face of the escarpment of the terrace structure, other crystallographically equivalent directions represented by <011> can also be used.

Moreover, in both of the above embodiments, the multilayer structures can be selectively grown by MBE or other techniques as well as by the MOCVD method.

Thus, in the semiconductor laser device of the present embodiment, the direction of polarization of the laser light emitted from the first and second multilayer structures are mutually perpendicular. Therefore, by appropriately regulating the respective voltages impressed upon the first, second, and third electrodes, two varieties of laser light with different directions of polarization can be emitted either simultaneously or at different times.

Therefore, using the semiconductor laser devices of the present invention, two varieties of laser light with directions of polarization differing by 90° can be emitted from a single semiconductor laser device, which greatly facilitates the miniaturization and reduction of the number of components required in optical measuring instruments.

According to the above-described method of fabrication, selective growth of semiconductor layers is effected under conditions such that crystal growth on {111} planes is difficult, and thereby several multilayer structures possessing active regions can be simultaneously formed on the upper face and lateral faces of a ridge structure, or on the upper level and the lateral escarpment face of a terrace structure. This permits the fabrication, by a simple process, of semiconductor laser devices which can emit two varieties of laser light polarized in directions mutually differing by 90°.

Figure 29:
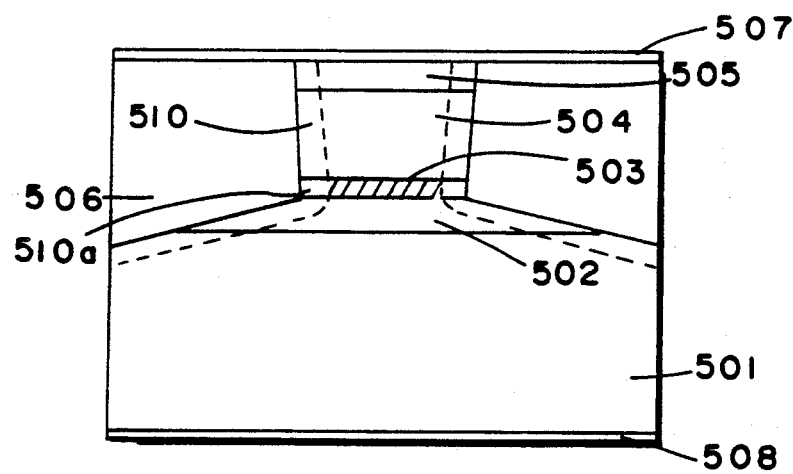
FIG. 29 is a cross-sectional view of an eighteenth embodiment of the present invention.

FIG. 29 shows a cross-sectional view of a semiconductor laser device of an eighteenth embodiment. Over an n-type indium phosphide substrate 501 (carrier concentration $n \geq 10^{17}/cm^3$) is formed a mesa stripe structure of width 3 μm, consisting of an n-type indium phosphide buffer layer 502 (thickness 1 μm, carrier concentration $n = 10^{18}/cm^3$), an active layer 503 (thickness 0.1 μm, oscillation wavelength 1.3 μm), a p-type indium phosphide cladding layer 504 (thickness 1 μm, carrier concentration $p = 10^{17}/cm^3$), and a p-type GaInAs cap layer 505 (thickness 0.5 μm, carrrier concentration $p = 10^{17}/cm^3$), laminated in that order from the side of the substrate 501.

The side faces of the said mesa stripe structure are covered by a burying layer. The burying layer consists of an SOG film 506 containing appropriate dopants. A p-terminal electrode 507 is formed on the upepr surface levelled by the SOG film 506. Also, an m-terminal electode 508 is formed on the reverse face of the substrate 501.

Thus, the burying layer of the semiconductor laser device of the present embodiment consists of an SOG layer 506, which is formed from an SOG solution. This SOG solution is composed of an organic solvent such as alcohol or ether containing minute particles (diameter of the order of 0.45 μm or less) of an appropriate silicon compound $(R_nSi(OH)_{4-n})$. If the SOG solution is baked at a temperature in the range of approprriately 400° to 600° C., the organic solvent evaporates and a vitreous SOG film is formed by the sintering of the particles of the said silicon compound. If the SOG film 506 is baked at a temperature in the range of approximately 400° to 500° C. or above, then the properties of the resulting film are almost the same as those of a silica film.

The formation on the substrate of a thick silica film, with thickness of the order of 1 to 5 μm, is difficult to achieve by methods such as sputtering, etc., but the formation of the required thick SOG film 506 is simple.

Even if the grooves formed on the wafer by the formation of the mesa stripe structure are relatively deep grooves with a large aspect ratio, nevertheless, the grooves can be completely filled by coating with an SOG solution. Thus, after coating, application of the baking process provides an SOG film 506 buryied in deep grooves.

If the SOG film 506 is baked at a temperature below 500° C., then the organic solvent is not completely evaporated, and a portion of this solvent remains in the SOG film 506. Consequently, the bulk modulus of the SOG film 506 is substantially reduced as compared with that of an ordinary silica film. If such an SOG film 506 is used as the burying layer of a semiconductor laser device, then even if the device undergoes large temperature variations in the course of the manufacturing process or during operation, cracks in the SOG film 506 or imposition of stress in the semiconductor layers due to differences between the thermal expansion coefficients of the active layer and then said SOG film 506 do not occur. Silica films formed by conventional methods such as sputtering, etc., possess more compact microstructure than the SOG film 506, hence, when the temperature of the device varies, owing to the disparity between the thermal expansion coefficients of the semiconductor layers ($4.75 \times 10^{-6}$/deg for indium phosphide, $6.63 \times 10^{-6}$/deg for gallium arsenide) and that of the silica film ($0.4 \times 10^{-6}$/deg), cracks in the silica film or imposition of stress upon the aforesaid semiconductor layers is prone to occur in semiconductor laser devices which incorporate such conventionally formed silica films.

The thermal conductivity of the SOG film 506 is 0.014 W/cm$^{-1}$deg$^{-1}$. This value is even greater than that of, for example, polyimide resins (0.0042 W/cm$^{-1}$deg$^{-1}$). Therefore heat generated within the active layer is effective released into heat sinks, etc., via the SOG film 506 which constitutes the burying layer.

If SOG solutions with added dopants (impurities) are used, then the SOG film 506 formed from these SOG solutions can also be utilized as an impurity diffusion source. In this manner, a diffusion zone containing dopants diffused from the SOG film 506 can be formed within the mesa stripe structure in the region adjacent to the said SOG film 506.

Owing to the formation of the diffusion zone within the mesa stripe structure, the width of the undoped region within the active layer is diminished, and consequently the width of the region within the active layer contributing to light emission becomes narrower than the width of the mesa stripe structure. Therefore, in the semiconductor laser device of the present embodiment, even if the mesa stripe structure is comparatively wide, light can be effectively confined to a prescribed region within the mesa stripe structure, hence, stable laser light oscillations in the single transverse mode can be ensured.

Figure 30:
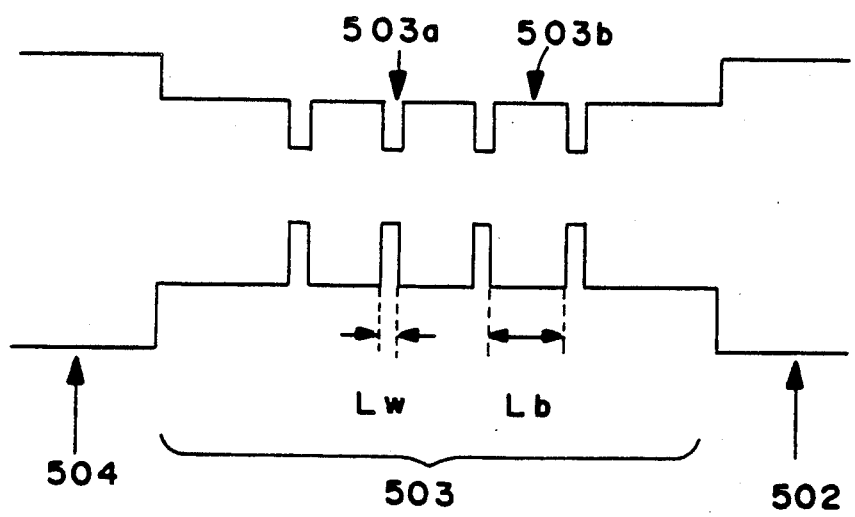
FIG. 30 is a band diagram for the eighteenth embodiment of the present invention.

FIG. 30 shows a band diagram of the active layer 503. This active layer 503 has a multiquantum well (MQW) structure formed by periodic growth of 4 to 5 atomic layers of $Ga_{0.47}In_{0.53}As$ (well layer, 503a) and 5 to 6 atomic layers of GaInAsP (barrier layer, 503b). As shown by FIG. 30, the band gap of the GaInAsP barrier layer 503b thickness Lb is greater than that of the $Ga_{0.47}In_{0.53}As$ well layer of thickness Lw. The composition of the GaInAsP barrier layer can be varied in accordance with the wavelength of the laser light which is to be emitted. In the present embodiment, the composition was adjusted so that the laser wavelength would be 1.3 μm.

In the present embodiment, Lb is of the order of 50 to 300 angstroms, and Lw of the order of 50 to 100 angstroms. However, the thickness of the GaInAsP barrier layers 503b which are contiguous with the n-type indium phosphide buffer layer 502 or the p-type indium phosphide cladding layer 504 can be greater than the thickness Lb of the other GaInAsP barrier layers 503b. In that case, a separate confinement heterostructure (SCH), wherein the GaInAsP barrier layers 503b of greater thickness function as light guide layers, is formed within the laser device.

In the mesa stripe structure including the active layer 503, an impurity diffusion zone 510 is formed in the region within a distance of approximately 0.5 μm from the interface between the SOG film 506 and the mesa stripe structure. This impurity diffusion zone 510 is formed by diffusion of dopants from the SOG film 506. In the zone 510a within the active layer doped by the dopants, the diffusion of the dopants causes disordering of the quantum well structure. In the active layer 503, the refractive index of the disordered zone 510a is lower then that of the region where heterocrystallization has not occured. Consequently, the laser light generated in the active layer 503 is confined within the undisordered region surrounded by the disordered zone 510a.

In the active layer 503, if the width of the region wherein the laser light is essentially confined is denoted by Wa, the width of one side of the heterocrystalline zone 510a by D, and the width of the mesa stripe structure by Ws, then the latter quantity is expressed by the following relation.

$$Ws = Wa + 2D$$

In order to ensure that the transverse mode of oscillation is the single fundamental mode, Wa must be of the order of 2 μm. Accordingly, in the present embodiment, D was adjusted to 0.5 μm and Ws to 3 μm, so that Wa was 2 μm. Thus, in the present embodiment, although the width of the mesa stripe structure was 1.5 times that of the usual mesa stripe structures in conventional semiconductor laser devices (i.e., 2 μm), the effective width of the active layer was nevertheless of the order of 2 μm, and therefore the laser light oscillations were in the single fundamental transverse mode. Thus, in this manner, one can obtain semiconductor laser device possessing comparatively wide mesa stripe structures which are not easily damaged in the levelling process, but nevertheless emit laser light oscillating in the single fundamental transverse mode.

In the present embodiment, the disordered zone 510a is located between the light-emitting region of the active layer 503 and the SOG film 506, hence, there is no direct contact between the light-emitting region of the active layer 503 and the SOG film 506. Therefore, no adverse effects upon the light-emitting region of the active layer 503 arise from recombination levels formed at the interface between the active layer 503 and the SOG film 506, hence, the long-term reliability of the device is improved.

Moreover, in the present embodiment, since the SOG film with excellent thermal conductivity was used as the burying layer, heat generated within the active layer was efficiently released to the exterior of the device. Thus, since the temperature elevation of the active layer was inhibited, the threshold current was low, and differential efficiency was increased.

Furthermore, since the SOG film has a high electrical resistance and low permittivity, response characteristics with respect to driving voltage modulation were improved.

Furthermore, the bulk modulus of the SOG film was substantially lower than that of ordinary silica films, therefore, cracks in the SOG film or large stresses imposed upon the semiconductor layers due to the SOG film did not occur.

Figure 31A:
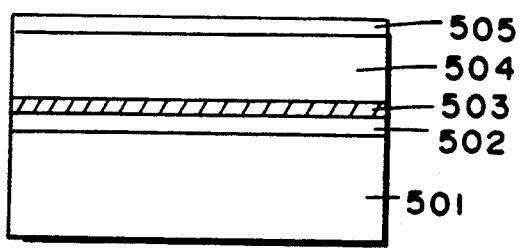
FIGS. 31A through 31D are cross-sectional views illustrating the process of fabrication of the eighteenth embodiment of the present invention.

Next, a method of fabrication of the semiconductor laser device illustrated in FIG. 29 will be explained with reference to FIGS. 31A through 31D. First, using MOCVD techniques, the n-type indium phosphide buffer layer 502, the active layer 503, the p-type indium phosphide cladding layer 504 and the p-type GaInAs cap layer 505, in that order, were grown on the n-type indium phosphide substrate 501 (FIG. 31A).

In this procedure, when the active layer 503 was formed, 4 to 5 atomic layers 503a of $Ga_{0.47}In_{0.53}As$ and 5 to 6 atomic layers 503b of GaInAsp were grown alternately.

Figure 31B:
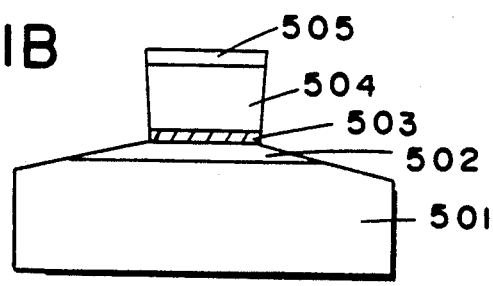

After forming the p-type GaInAs cap layer 505 over the active layer 503, a resist (not indicated in the Figure) of width 3 μm with the required mesa stripe pattern was formed on the cap layer 505, and mesa etching was performed in an inverted mesa direction (FIG. 31B). The etchant used was a 0.2% solution of bromine in methanol at 20° C. After the mesa etching, an SOG solution was spin-coated onto the wafer without removing the resist. The SOG solution used contained a 10 mol% concentration of zinc oxide. In addition to zinc oxide, other suitable dopant impurities such as stannous oxide can also be added to the SOG solution. Also, phosphoric acid was added to the SOG solution to prevent the thermal dissociation of phosphorus, as the group V device of the III-V group semiconductor, from the indium phosphide during the diffusion process. Similarly, if the group V device of the III-V semiconductor used is arsenic, then AsO or diarsenic trioxide can be added to the SOG solution for the analogous purpose.

The spin coating was performed for 15 to 20 seconds at the wafer rotational speed of 100 to 3000 rpm. The spin coating process may be repeated several times in order to further improve the flatness of the wafer surface. By repeating this process several times, a deep channel can be completely buried.

Figure 31C:
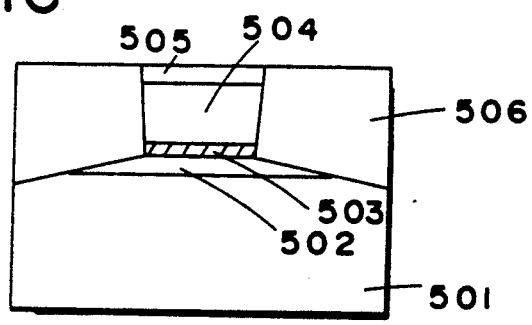
Figure 31D:
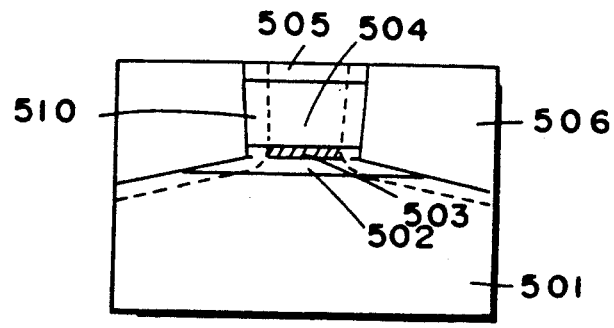

After the coating of the SOG solution, the wafer was baked at 500° C. for 30 minutes. By this baking process, the required burying layer was formed from the SOG film 506 (FIG. 31C). Then, the wafer was baked for a further 2 to 3 minutes at 650° C. to dope the mesa stripe structure with zinc from the SOG film 506 (FIG. 31D). The depth of diffusion of the zinc into the active layer, determined by the temperature and time of this baking process, was approximately 0.5 μm. Therefore, disordering occurred in the zone of the active layer 503 extending for approximately 0.5 μm from the side faces of the active layer. The depth of zinc diffusion into the indium phosphide buffer layer 502 and the indium phosphide cladding layer 504 was also approximately 0.5 μm.

After the upper surface of the wafer had been levelled by the formation of the SOG film 506 as the burying layer, the p-terminal electrode 507 was formed on the upper surface of the wafer and the n-terminal electrode 508 on the reverse face of the substrate 501.

Thus, in the present embodiment, although deep grooves had been formed on the top of the wafer, the upper surface of the wafer was easily levelled by the spin-coating of the SOG film 506.

Figure 32:
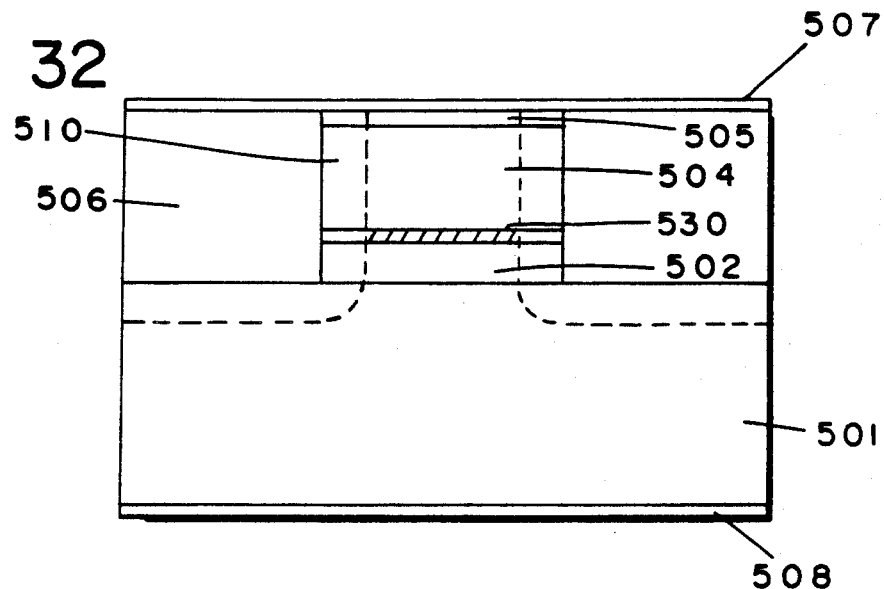
FIG. 32 is a cross-sectional view of a nineteenth embodiment of the present invention.

FIG. 32 illustrates a nineteenth embodiment of the invention. The semiconductor laser device of the present embodiment has a burying type double heterostructure. A mesa stripe having the BH structure is formed by superimposition upon an n-type indium phosphide substrate 501 of an n-type indium phosphide cladding layer 502, an undoped GaInAsP active layer 530, a p-type indium phosphide cladding layer 504, and a p-type GaInAs cap layer 505, in that order, from the side of the substrate 501.

Thus, the semiconductor laser device of the present embodiment has a structure similar to that of the embodiment described in the preceding account, except that the 3 μm-thick active layer 530 is a simple layer without a quantum well structure.

As shown in FIG. 32, the upper surfaces of the SOG film 506 are levelled, and a p-terminal electrode 507 is formed on this levelled upper surface. Also, an n-terminal electrode 508 is formed on the reverse face of the substrate 501.

In both the mesa stripe structure and the substrate 501, a diffusion zone 510 (about 0.5 μm width) has been formed in the region adjacent to the SOG film 506 as a result of doping p-type impurities, that is, zinc, which have diffused from the SOG film 506. In the present embodiment, the impurity concentration in this diffusion zone 510 is of the order of $10^{19}/cm^3$. This impurity concentration is even higher than the concentration of n-type impurities in both the n-type indium phosphide substrate 501 and the n-type indium phosphide buffer layer 502, therefore, the electrical conductivity of the diffusion zone 510 in both the n-type indium phosphide substrate 501 and the n-type indium phosphide buffer layer 502 is also p-type. Thus, a p-n junction is formed within the n-type indium phosphide substrate 501 and the n-type indium phosphide buffer layer 502. Since this p-n junction is a homojunction, the diffusion potential (built-in potential) Vb1 of this junction is smaller than the diffusion potential Vb2 of the double heterojunction. Consequently, the driving current is confined within the region of the mesa stripe structure which has not been doped by the p-type impurities.

Also, the impurity concentration of the diffusion zone 510 is higher than the impurity concentration (of the order of $10^{18}/cm^3$) of the region of the active layer 530 undoped with the zinc, hence, owing to the plasma effect, the refractive index of the diffusion zone 510 is smaller than that of the region of the active layer 530 undoped with the zinc. Thus, the laser light generated in the active layer 530 is confined within the region of the width 2 μm undoped with zinc from the SOG film 506. In order to ensure that the light is effectively confined in this manner, the impurity concentration in the diffusion zone 510 should be of the order of $10^{19}/cm^3$.

The current confinement and light confinement permit stable oscillations in the single fundamental transverse mode. Moreover, just as in the embodiment described by the preceding account, since an SOG film 506 with excellent thermal conductivity is employed as a burying layer, heat generated within the active layer 530 is effectively released to the exterior of the device. Thus, since the temperature elevation of the active layer was inhibited, the threshold current was low, and differential efficiency was increased.

Furthermore, since the SOG film 506 has a high electrical resistance and low permittivity, response characteristics with respect to driving voltage modulation were improved.

The width of the mesa stripe structure and the impurity diffusion zone are not restricted to the values of the embodiment described, and other values can be set, provided only that these values lie in the ranges which permit the formation of an active layer having an effective width of the magnitude necessary for oscillations in the single fundamental mode.

Also, although GaInAsP/InP semiconductors systems were used in the eighteenth and nineteenth embodiments, other appropriate semiconductor systems can also be used.

Thus, according to the present embodiment, even if the mesa stripe structure is comparatively wide, light and current can be effectively confined to a prescribed region within the said mesa stripe structure, hence, stable laser light oscillations in the single transverse mode can be ensured even for low excitation currents.

Moreover, in the present embodiment, since an SOG film with excellent thermal conductivity is used as the burying layer, heat generated within the active layer is efficiently released to the exterior of the device. Thus, since the temperature elevation of the active layer is inhibited, the threshold current is low, and differential efficiency is increased.

Also, since the SOG film has high electrical resistance and low permittivity, response characteristics with respect to driving voltage modulation are improved over the prior art.

Moreover, the bulk modulus of the SOG film is substantially lower than that of ordinary silica films, therefore, cracks in the burying layer or large stresses imposed upon the semiconductor layers of the mesa stripe structure due to the SOG film do not occur.

Furthermore, the SOG film serves to completely bury the lateral faces of the mesa stripe structure and to level the surface of the wafer.

Figure 33:
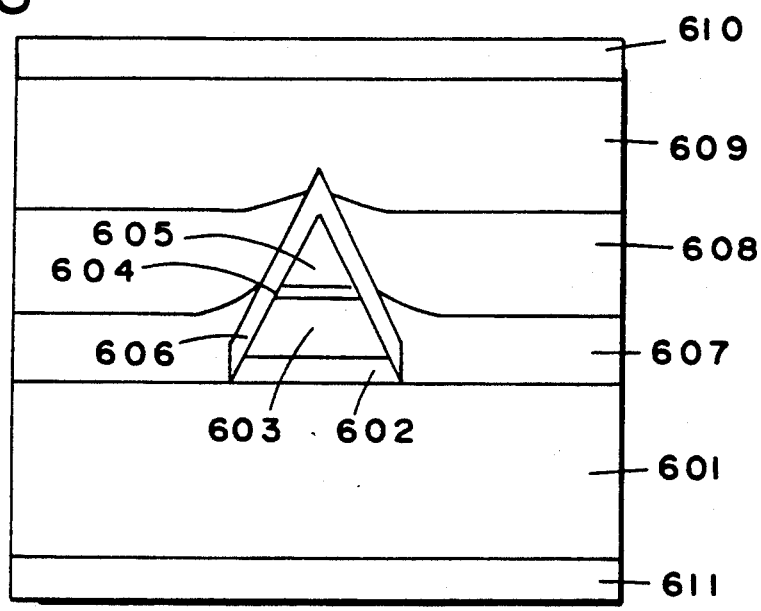
FIG. 33 is a cross-sectional view of a twentieth embodiment of the present invention.

A twentieth embodiment of the present invention will be explained in the following account. FIG. 33 shows the distributed feedback type semiconductor laser device (DFB semiconductor laser device) of the this embodiment. The DFB semiconductor laser device was fabricated as follows.

Figure 34A:
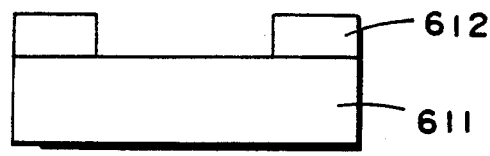
FIGS. 34A through 34E are cross-sectional views illustrating the process of fabrication of the twentieth embodiment of the present invention.
Figure 34B:
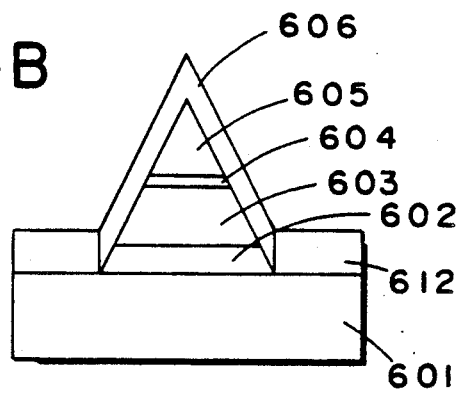

First, as shown by FIG. 34A, a silica film was formed on a (100)-oriented n-type gallium arsenide substrate 1 by a vapor-deposition technique. Next, a stripe-shaped channel approximately 3.3 μm wide, running in the [011] direction, was formed by a photolithographic technique, thereby forming a silica mask 612. Next, as shown by FIG. 34B, a selenium-doped n-type gallium arsenide buffer layer 602 of thickness 0.5 μm, a selenium-doped n-type $Al_{0.5}Ga_{0.5}As$ cladding layer 603 of thickness 0.8 μm, an undoped $Al_{0.13}Ga_{0.87}As$ active layer 604 of thickness 0.1 μm, and a zinc-doped p-type $Al_{0.5}Ga_{0.5}As$ cladding layer 605 of thickness 0.8 μm were successively grown by the MOCVD method. The principal growth conditions in this process were a substrate temperature of 750° C., a growth pressure of 100 torr, and a V/IV ratio of 120. In this process, the plane orientation dependence of crystal growth rates in the MOCVD method was utilized so that under the growth conditions the layers so grown formed {111} B planes. As a result, the cross-section of the grown stripe-like multilayer structure (including a double heterostructure) formed in this manner, was an isosceles triangle with base angle 54.7°, and with {111} B planes as the side faces of the structure corresponding to the legs of the triangle.

Figure 34C:
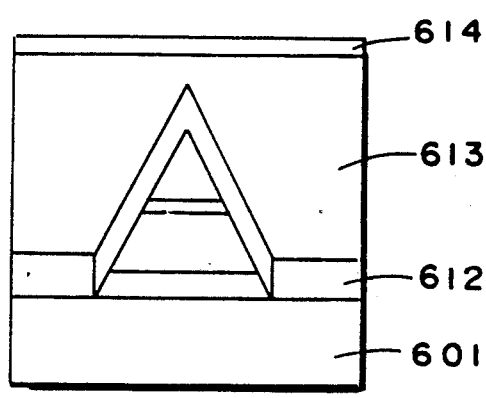
Figure 34D:
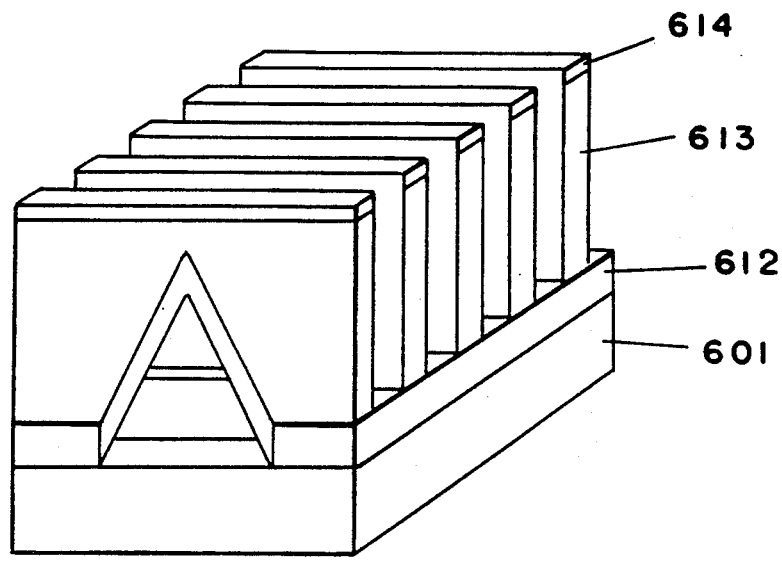
Figure 34E:
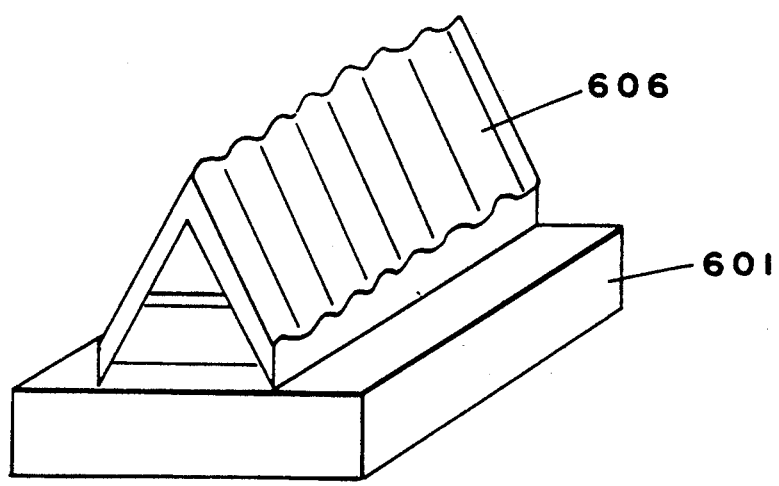
Figure 35:
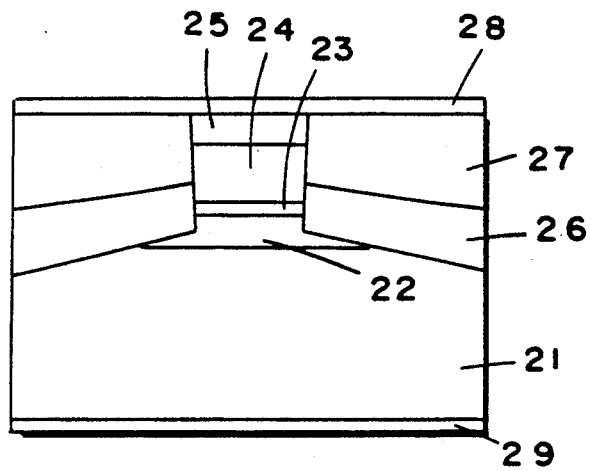
FIG. 35 is a cross-sectional view illustrating a prior art.
Figure 36:
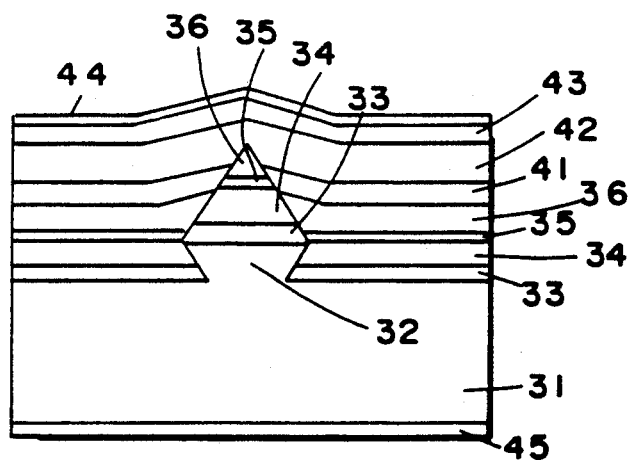
FIG. 36 is a cross-sectional view illustrating other prior art.
Figure 37:
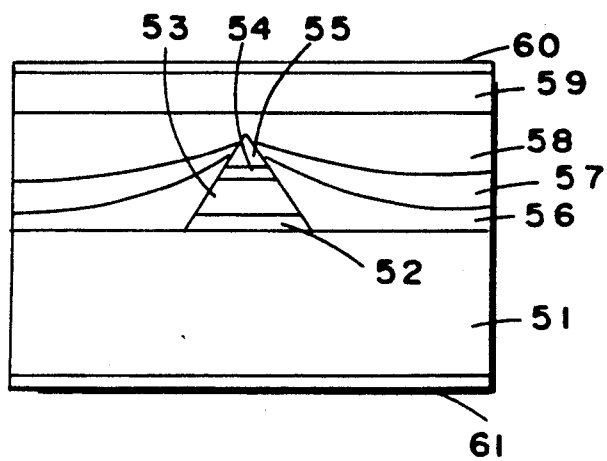
FIG. 37 is a cross-sectional view illustrating still other prior art.
Figure 38:
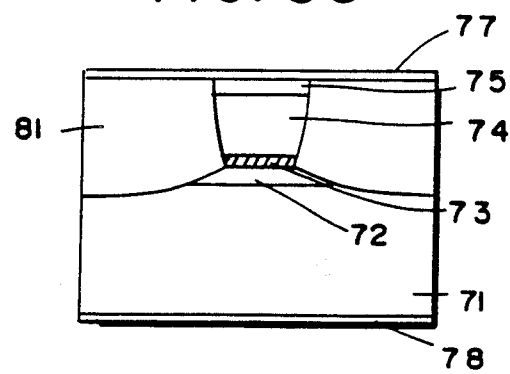
FIG. 38 is also a cross-sectional view illustrating still other prior art.
Figure 39:
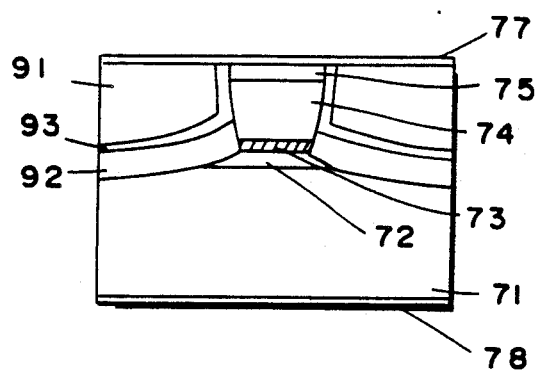
FIG. 39 is also a cross-sectional view illustrating still other prior art.
Figure 40:
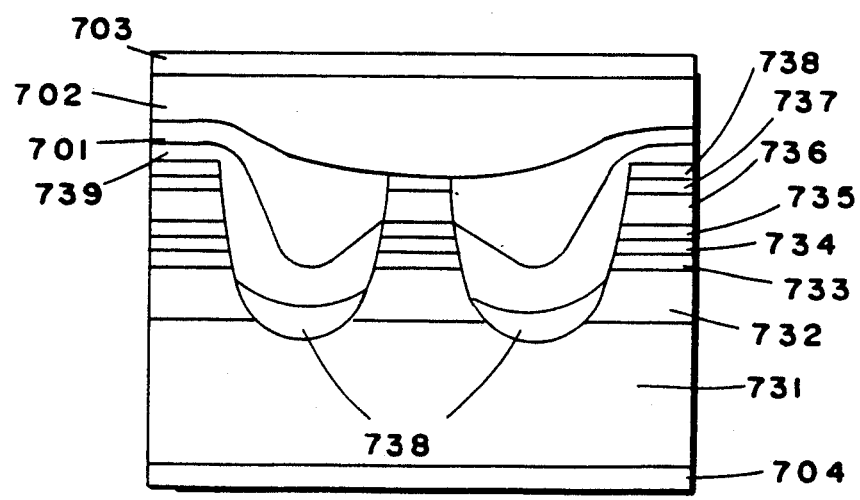
FIG. 40 is also a cross-sectional view illustrating still other prior art.

Next, a zinc-doped p-type $Al_{0.25}Ga_{0.75}As$ light guide layer 606 of thickness 0.15 μm was grown on these {111} B plane facets. Then, as shown by FIG. 34C, a novolak-base resist was thickly coated so as to cover the stripe-like multilayers, thereby levelling the upper surface of the wafer and forming the first resist layer 613. Onto this was applied a thin coat of chloromethylated polyphenylsiloxane, characterized by high resistance to oxygen plasma etching, thereby forming the second resist layer 614. Next, as shown by FIG. 34D, a diffraction grating pattern was formed on the second resist layer 614 by an electron beam exposure technique, then, the first resist layer 613 was etched by a oxygen plasma etching process using the diffraction grating pattern of the second resist layer 614 as an etching mask. During this process, the rate of etching of the p-type $Al_{0.25}Ga_{0.75}As$ light guide layer 606 was extremely slow, and consequently a diffraction pattern was formed on the oblique faces of the p-type $Al_{0.25}Ga_{0.75}As$ guide layer 606. Next, as shown by FIG. 34E, a diffraction grating was ruled on the p-type $Al_{0.25}Ga_{0.75}As$ guide layer 606 by a dry etching process such as ion beam etching, or by a wet etching process. The process of ruling a diffraction pattern is that which is conventionally used in the LSI technology for the formation of masks on silicon substrates with level differences, etc., and is known in the art as the multilayer resist (MLR) process.

The first resist layer 613 as well as the second resist layer 614 were removed by cleaning with an organic solvent, and the silica mask 612 was removed with hydrofluoric acid, after which MOCVD techniques were used to successively grow a first current blocking layer 607 composed of zinc-doped p-type p-GaAs (thickness 0.9 μm), a second current blocking layer 608 composed of selenium-doped n-type gallium arsenide (thickness 0.9 μm), and a zinc-doped p-type gallium arsenide cap layer 609 (thickness 1 μm), in that order.

Finally, an n-terminal electrode 611 was formed on the reverse face of the substrate 601, and a p-terminal electrode 610 was formed on the upper surface of the cap layer 609, thereby obtaining the DFB semiconductor laser device illustrated in FIG. 33.

In this embodiment, the MOCVD methods were used for crystal growth, but the MBE methods may be employed for this purpose. Moreover, a p-type gallium arsenide substrate could be used, and then semiconductor layers of conductivity types opposite to those of the corresponding layers in the embodiment grown above the substrate.

In the present embodiment, no mesa etching process is required, moreover, only two crystal growth processes are necessary. Therefore, the overall manufacturing process is simplified, hence, mass production is possible, thus, DFB semiconductor laser devices with excellent performance characteristics can be obtained with high yield.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser device comprising:
    a semiconductor substrate;
    a current blocking layer formed on said semiconductor substrate;
    a channel formed in said current blocking layer, said channel reaching said substrate;
    a mesa stripe having a multilayer structure and formed on said substrate within said channel, said multilayer structure including an active layer;
    a burying layer covering the side faces of said multilayer structure;
    wherein the main surface of said substrate is a (100) plane, said channel is oriented along the <011> direction, and said side faces of said multilayer structure are facets of {111} planes.

2. A semiconductor laser device according to claim 1, wherein the electrical resistance of said burying layer is higher than that of said multilayer structure.

3. A semiconductor laser device according to claim 1, wherein said burying layer consists of an SOG.

4. A semiconductor laser device according to claim 1, wherein said current blocking layer is made of semiconductor material.

5. A semiconductor laser device according to claim 1, wherein said current blocking layer is made of dielectric material.

6. A semiconductor laser device according to claim 1, wherein said current blocking layer is made of semiconductor material containing aluminum.

7. A semiconductor laser device comprising:
    a semiconductor substrate;
    a dielectric film formed on said semiconductor substrate;
    a channel formed in said dielectric film, said channel reaching said substrate;
    a mesa stripe having a multilayer structure formed on said substrate within said channel, and said multilayer structure including an active layer; and
    a burying layer covering the side faces of said multilayer structure;
    wherein the main surface of said substrate is a (100) plane, said channel is oriented along the <011> direction, said side faces of said multilayer structure are facets of {111} planes, said multilayer structure comprises a lower portion including an active layer and an upper portion including a semiconductor layer having a refractive index smaller than that of said active layer, and said semiconductor layer covers the side faces of said active layer.

8. A semiconductor laser device according to claim 7, wherein the electrical resistance of said burying layer is higher than that of said multilayer structure.

9. A semiconductor laser device according to claim 7, wherein said burying layer consists of an SOG.

10. A semiconductor laser device comprising:
    a semiconductor substrate;
    a channel formed on said semiconductor substrate;
    a mesa stripe having a multilayer structure formed on said substrate within said channel, and said multilayer structure including an active layer; and
    a burying layer covering the said multilayer structure;
    wherein the main surface of said substrate is a (100) plane, said channel is oriented along the <011> direction, and said side face of said multilayer structure are facets of {111} planes.

11. A semiconductor laser device according to claim 10, wherein the electrical resistance of said burying layer is higher than that of said multilayer structure.

12. A semiconductor laser device according to claim 10, wherein said burying layer consists of an SOG.

13. A semiconductor laser device comprising:
a semiconductor substrate;
a stripe-like ridge structure formed on said semiconductor substrate;
a first multilayer structure, including a first active region, formed on the upper face of said ridge structure;
a second multilayer structure, including a second active region, formed on the one side face of said ridge structure;
a third multilayer structure, including a third active region, formed on the other side face of said ridge structure;
a burying layer covering said first, second, and third multilayer structures;
a first electrode, a second electrode, and a third electrode formed on said burying layer;
a first diffusion region formed in said burying layer, and electrically connecting said first multilayer structure to said first electrode;
a second diffusion region, formed in said burying layer, and electrically connecting said second multilayer structure to said second electrode; and
a third diffusion region, formed in said burying layer, and electrically connecting said third multilayer structure to said third electrode.

14. A semiconductor laser device comprising:
a semiconductor substrate;
a terrace structure formed on said semiconductor substrate;
a first multilayer structure, including a first active region, formed on the upper level of said terrace structure;
a second multilayer structure, including a second active region, formed on the side face of the escarpment of said terrace structure;
a burying layer covering said first and second multilayer structures;
a first electrode, and a second electrode formed on said burying layer;
a first diffusion region formed in said burying layer, and electrically connecting said first multilayer structure to said first electrode; and
a second diffusion region, formed in said burying layer, and electrically connecting said second multilayer structure to said second electrode.

15. A semiconductor laser device having a mesa stripe including an active layer in which the side faces of the mesa stripe are covered by a burying layer, wherein said burying layer is an SOG film containing dopants, and the device further comprises a diffusion zone containing said dopants diffused from said burying layer, said diffusion zone being formed in the region of said mesa stripe adjacent to said burying layer.

16. A distributed feedback type semiconductor laser device comprising:
a semiconductor substrate;
a mesa stripe having a multilayer structure and formed on said substrate, said multilayer structure including an active layer;
a light guide layer formed on the side face of said multilayer structure, on which a diffraction is ruled; and
a burying layer covering said light guide layer;
wherein the main surface of said substrate is a (100) plane, said channel is oriented along the <011> direction, and said side faces of said multilayer structure are facets of {111} planes.

* * * * *